(12) United States Patent
Hekmatshoar-Tabari et al.

(10) Patent No.: US 8,980,737 B2
(45) Date of Patent: Mar. 17, 2015

(54) METHODS OF FORMING CONTACT REGIONS USING SACRIFICIAL LAYERS

(71) Applicant: International Business Machines Corporation, Armonk, NY (US)

(72) Inventors: Bahman Hekmatshoar-Tabari, Mount Kisco, NY (US); Tak H. Ning, Yorktown Heights, NY (US); Devendra K. Sadana, Pleasantville, NY (US); Ghavam G. Shahidi, Round Ridge, NY (US); Davood Shahrjerdi, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 13/839,161

(22) Filed: Mar. 15, 2013

(65) Prior Publication Data
US 2013/0316520 A1  Nov. 28, 2013

Related U.S. Application Data

(60) Provisional application No. 61/651,140, filed on May 24, 2012.

(51) Int. Cl.
*H01L 21/44* (2006.01)
*H01L 21/02* (2006.01)

(52) U.S. Cl.
CPC .................... *H01L 21/02639* (2013.01)
USPC ........................ 438/607; 438/597

(58) Field of Classification Search
USPC ................................ 438/597, 607
See application file for complete search history.

(56) References Cited

U.S. PATENT DOCUMENTS

| 5,196,907 A | 3/1993 | Birkle et al. |
| 5,686,734 A | 11/1997 | Hamakawa et al. |

(Continued)

FOREIGN PATENT DOCUMENTS

| WO | WO 2006040735 A1 | 4/2006 |
| WO | WO 2007088494 A1 | 8/2007 |
| WO | WO 2008017714 A1 | 2/2008 |

OTHER PUBLICATIONS

Sakamoto, Y., et al; "Perfluoropentacene: High-performance p—n junctions and complementary circuits with pentacene", Journal of the American Chemical Society, (Jul. 7, 2004), vol. 126, No. 26, pp. 8138-8140.

(Continued)

*Primary Examiner* — Bradley K Smith
(74) *Attorney, Agent, or Firm* — Scully, Scott, Murphy & Presser, P.C.; Louis J. Percello, Esq.

(57) ABSTRACT

Methods of patterning semiconductor contact materials on a crystalline semiconductor material which allow high-quality interfaces between the crystalline semiconductor material and the patterned semiconductor contact material are provided. Blanket layers of passivation material and sacrificial material are formed on the crystalline semiconductor material. A first contact opening is formed into the blanker layer of sacrificial material. The first contact opening is extended into blanket layer of passivation material, stopping on a first surface portion of the crystalline semiconductor material, using remaining sacrificial material portions as an etch mask. A semiconductor contact material is formed on the exposed first surface portion of the crystalline semiconductor material. In some embodiments, an electrode material portion can be formed over the first contact opening, and then a second blanket layer of sacrificial material can be formed, followed by forming a next contact opening.

26 Claims, 10 Drawing Sheets

(56) References Cited

U.S. PATENT DOCUMENTS

| | | | |
|---|---|---|---|
| 6,534,790 | B2 | 3/2003 | Kato et al. |
| 8,084,786 | B2 | 12/2011 | John et al. |
| 8,779,597 | B2 | 7/2014 | Lee |
| 2003/0207524 | A1 | 11/2003 | Zhang et al. |
| 2004/0256633 | A1 | 12/2004 | Thornton |
| 2010/0314664 | A1 | 12/2010 | John et al. |
| 2011/0003456 | A1* | 1/2011 | Mazzola ............... 438/424 |
| 2012/0049282 | A1 | 3/2012 | Chen et al. |
| 2012/0118383 | A1 | 5/2012 | Bedell et al. |
| 2012/0210932 | A1 | 8/2012 | Hekmatshoartabari et al. |
| 2012/0228611 | A1 | 9/2012 | Chan et al. |
| 2013/0313552 | A1* | 11/2013 | Hekmatshoar-Tabari et al. ............... 257/51 |

OTHER PUBLICATIONS

Klauk, H. et al., "Flexible organic complementary circuits", Electron Devices, IEEE Transactions on Electron Devices, (Apr. 2005), vol. 52, No. 4, pp. 68-622.

Hekmatshoar, B. et al., "Heterojunction bipolar transistors with hydrogenated amorphous silicon contacts on crystalline silicon", Electronic Letters, (Aug. 30, 2012), vol. 48, No. 18, pp. 1161-1163.

U.S. Appl. No. 13/481,048 entitled, "Bipolar Junction Transistor with Epitaxial Contacts", filed May 25, 2012, First Named Inventor: Bahman Hekmatshoartabari.

U.S. Office Action dated Aug. 1, 2014 received in U.S. Application, namely U.S. Appl. No. 13/389,100.

U.S. Office Action dated Aug. 21, 2014 received in U.S. Application, namely U.S. Appl. No. 13/838,695.

Gelatos, A.V. and Kanicki, J., "Investigation of the Silicon Nitride on Hydrogenated Amorphous Silicon Interface", Mat. Res. Soc. Symp. Proc., 1989, vol., 149., pp. 729-734.

Campmany, J.L., et al., "Plasma-deposited silicon nitride films with low hydrogen content for amorphous silicon thin-film transistors application", Sensors and Actuators A, 1993, v.77-38, pp. 333-336.

Hekmatshoar, B., et al., "Novel heterojunction solar cells with conversion efficiencies approaching 21% on p-type crystalline silicon substrates", Electron Devices Meeting (IEDM), 2011 IEEE International, Date of Conference: Dec. 5-7, 2011, pp. 36.6.1-36.6.4.

Office Action dated Dec. 8, 2014 received in U.S. Appl. No. 13/839,100.

Office Action dated Nov. 24, 2014 received in U.S. Appl. No. 13/839,213.

* cited by examiner

METHODS OF FORMING CONTACT REGIONS USING SACRIFICIAL LAYERS

RELATED APPLICATION

The present application claims benefit of U.S. Provisional Application Ser. No. 61/651,140, filed on May 24, 2012, the entire content of which is incorporated herein by reference.

BACKGROUND

The present disclosure relates to methods of forming contact regions for semiconductor structures, and more particularly, to methods of forming p-type and n-type semiconductor material contacts on a same side of a crystalline semiconductor material.

In some applications in which hydrogenated amorphous silicon (a-Si:H) and similar semiconductor materials are used as semiconductor contacts for realizing hybrid devices on crystalline semiconductor substrates, such as inter-digitated back-contact heterojunction solar cells, or bipolar junction transistors, such semiconductor contact materials need to be patterned, followed by the deposition of the next semiconductor contact material, e.g., a-Si:H (or similar semiconductor material) layer(s). To ensure a high-quality interface with a low density of interface states, the surface of the crystalline semiconductor material needs to be sufficiently clean and also typically hydrogen terminated to prevent oxidation of the crystalline semiconductor material surface prior to the deposition of the semiconductor contact material.

Since patterning of the first semiconductor contact material typically requires lithography, the deposition of the next semiconductor contact material, e.g., a-Si:H (or similar semiconductor material) layer(s), will require cleaning of the exposed surface of the crystalline semiconductor material to remove organic photoresist residues which form due to the patterning process; however, most effective cleaning techniques such RCA or piranha damage the first semiconductor contact material, e.g., a-Si:H (or similar semiconductor material) layer(s). In addition, patterning of the next semiconductor contact material will typically etch (partially or fully) or damage the first semiconductor contact material. Therefore a hard mask may be used to protect the first semiconductor contact material; however, removing the hard mask after etching will typically etch or damage the first semiconductor contact material. Removal of the hard mask may not be needed if the hard mask is comprised of a conductive material such as a metal, however, conductive materials are typically damaged during the hydrogen termination step required prior to the deposition of the second semiconductor contact material.

SUMMARY

Methods of patterning semiconductor contact materials such as, for example, a-Si:H, on a crystalline semiconductor material are disclosed which allow high-quality interfaces between the crystalline semiconductor material and the patterned semiconductor contact material, i.e., a-Si:H.

In one embodiment of the present disclosure, a method of forming a semiconductor material contact is provided that includes forming a material stack of, from bottom to top, a blanket layer of passivation material and a blanket layer of sacrificial material on a surface of a crystalline semiconductor material. The blanket layer of sacrificial material is then lithographically patterned to provide a first contact opening within the blanket layer of sacrificial material. The first contact opening is then transferred into the blanket layer of passivation material using remaining sacrificial material layer portions as an etch mask, wherein after transferring the first contact opening into the blanket layer of passivation material, a first surface portion of the crystalline semiconductor material is exposed. At least one first semiconductor material is then formed on the first surface portion of the crystalline semiconductor material and atop the remaining first sacrificial material layer portions. Next, a first electrode material portion is formed on a topmost surface of the at least one first semiconductor material and atop the first contact opening and atop the first contact opening. Exposed portions of the at least one first semiconductor material and sacrificial material layer portions not protected by the first electrode material portion are then removed. After the removal step, a remaining portion of the at least one first semiconductor material beneath the first electrode material portion comprises a first semiconductor material contact.

In another embodiment, a method is provided that include forming a material stack of, from bottom to top, a blanket layer of passivation material and a first blanket layer of first sacrificial material on a surface of a crystalline semiconductor material. The first blanket layer of first sacrificial material is lithographically patterned to provide a first contact opening within the first blanket layer of first sacrificial material. The first contact opening is then transferred into the blanket layer of passivation material using remaining first sacrificial material layer portions as an etch mask, wherein after transferring the first contact opening into the blanket layer of passivation material, a first surface portion of the crystalline semiconductor material is exposed. Next, at least one first semiconductor material is formed on the first surface portion of the crystalline semiconductor material and atop the remaining first sacrificial material layer portions. A first electrode material portion is then formed on a topmost surface of the at least one first semiconductor material and above the first contact opening. Next, a second blanket layer of second sacrificial material is formed on exposed portions of the at least one first semiconductor material and the first electrode material portion. The second blanket layer of second sacrificial material, a portion of the at least one first semiconductor material and one of the remaining first sacrificial material layer portions are then lithographically patterned to provide a second contact opening. The second contact opening is transferred into one of the remaining passivation material portions using remaining second sacrificial material layer portions as an etch mask, wherein after transferring the second contact opening, a second surface portion of the crystalline semiconductor material is exposed. Next, at least one second semiconductor material is formed on the second surface portion of the crystalline semiconductor material and atop the remaining second sacrificial material layer portions. A second electrode material portion is then formed on a topmost surface of the at least one second semiconductor material and atop the second contact opening. Next, remaining second sacrificial material layer portions, remaining portions of the at least one first semiconductor material, and remaining first sacrificial material layer portions are removed using the second electrode material portion and the first electrode material portion as etch masks, wherein a remaining portion of the at least one first semiconductor material beneath the first electrode material portion comprises a first semiconductor material contact, and wherein a remaining portion of the at least one second semiconductor material beneath the second electrode material portion comprises a second semiconductor material contact.

In some embodiments, the first semiconductor material contact and the second material contact are of an opposite conductivity type.

In yet another embodiment, the method of forming semiconductor material contacts includes forming a material stack of, from bottom to top, a blanket layer of passivation material and a first blanket layer of first sacrificial material on a surface of a crystalline semiconductor material. Next, the first blanket layer of first sacrificial material is lithographically patterned to provide a first contact opening within the first blanket layer of first sacrificial material. The first contact opening is then transferred into the blanket layer of passivation material using remaining first sacrificial material layer portions as an etch mask, wherein after transferring the first contact opening into the blanket layer of passivation material, a first surface portion of the crystalline semiconductor material is exposed. Next, a first semiconductor material comprising a crystalline semiconductor portion and adjoining non-crystalline semiconductor portions is formed, wherein the crystalline semiconductor portion is located on the first surface portion of the crystalline semiconductor material, and the non-crystalline semiconductor portions are formed atop the remaining first sacrificial material layer portions. A second blanket layer of second sacrificial material is then formed on the first semiconductor material. The second blanket layer of second sacrificial material is lithographically patterned to provide a second contact opening within the second blanket layer of second sacrificial material, one of the non-crystalline portions of the first semiconductor material, and one of the remaining first sacrificial material layer portions. Next, the second contact opening is transferred into one remaining passivation material layer portion using remaining second sacrificial material layer portions as an etch mask, wherein after transferring the second contact opening, a second surface portion of the crystalline semiconductor material is exposed. A second semiconductor material comprising a crystalline semiconductor portion and adjoining non-crystalline semiconductor portions is formed, wherein the crystalline semiconductor portion is located on the second surface portion of the crystalline semiconductor material, and the non-crystalline semiconductor portions are formed atop the remaining second sacrificial material layer portions. Next, the non-crystalline semiconductor portions of the second semiconductor material, remaining second sacrificial material layer portions, the non-crystalline semiconductor materials of the first semiconductor material and the remaining first sacrificial material layer portions are removed stopping on a topmost surface of the crystalline semiconductor portions of the first and second semiconductor material. In some embodiments, the crystalline semiconductor material of the first semiconductor material is of an opposite conductivity type as that of the crystalline semiconductor material of the second semiconductor material.

In an even further embodiment, a method of forming semiconductor material contacts is provided that includes a material stack of, from bottom to top, a blanket layer of passivation material and a first blanket layer of first sacrificial material on a surface of a crystalline semiconductor material. Next, the first blanket layer of sacrificial material is lithographically patterned to provide a first contact opening within the first blanket layer of first sacrificial material. The first contact opening is then transferred into the blanket layer of passivation material using remaining first sacrificial material layer portions as an etch mask, wherein after transferring the first contact opening into the blanket layer of passivation material, a first surface portion of the crystalline semiconductor material is exposed. Next, a first semiconductor material comprising a crystalline semiconductor portion and adjoining non-crystalline semiconductor portions is formed, wherein the crystalline semiconductor portion is located on the first surface portion of the crystalline semiconductor material, and the non-crystalline semiconductor portions are formed atop the remaining first sacrificial material layer portions. A second blanket layer of second sacrificial material is then formed on the first semiconductor material. The second blanket layer of second sacrificial material is lithographically patterned to provide a second contact opening within the second blanket layer of second sacrificial material, one of the non-crystalline portions of the first semiconductor material, and one of the remaining first sacrificial material layer portions. Next, the second contact opening is transferred into one remaining passivation material layer portion using remaining second sacrificial material layer portions as an etch mask, wherein after transferring the second contact opening, a second surface portion of the crystalline semiconductor material is exposed. Next a non-crystalline second semiconductor material is formed on the second surface portion of the crystalline semiconductor material and atop the remaining second sacrificial material layer portions. An electrode material portion is then formed on a surface of the non-crystalline second semiconductor material and atop the second contact opening. Next, exposed portions of the non-crystalline second semiconductor material, remaining second sacrificial material layer portions, the non-crystalline semiconductor materials of the first semiconductor material and the remaining first sacrificial material layer portions are removed stopping on a topmost surface of the crystalline semiconductor portion of the first semiconductor material and a portion of the non-crystalline second semiconductor material. In some embodiments, the crystalline semiconductor material of the first semiconductor material is of an opposite conductivity type than the remaining portion of the non-crystalline semiconductor material of the second semiconductor material.

DETAILED DESCRIPTION

Figure 1:
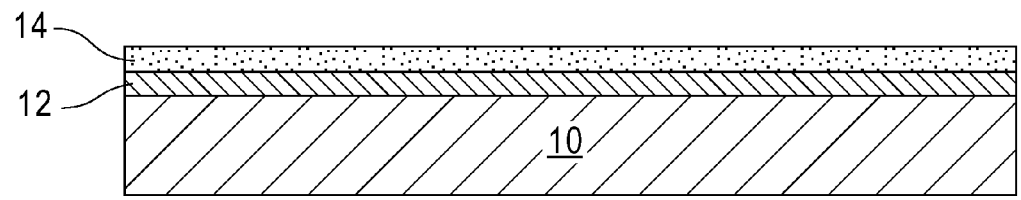
FIG. 1 is a pictorial representation (through a cross sectional view) illustrating a crystalline semiconductor material having a material stack of, from bottom to top, a blanket layer of passivation material and a blanket layer of sacrificial material located on one side of the crystalline semiconductor material in accordance with an embodiment of the present disclosure.

The present disclosure, which relates to methods of forming p-type and n-type semiconductor material contacts on a same side of a crystalline semiconductor material, will now be described in greater detail by referring to the following discussion and drawings that accompany the present application. It is noted that the drawings of the present application are provided for illustrative purposes and, as such, they are not drawn to scale. In the drawings and description that follows, like elements are described and referred to by like reference numerals.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

The present disclosure provides various methods of patterning semiconductor contact materials such as, for example, a-Si:H, on a crystalline semiconductor material. The methods of the present disclosure allow high-quality interfaces between the crystalline semiconductor material and the patterned semiconductor contact material, i.e., a-Si:H, while overcoming the drawbacks mentioned in the background section of the present disclosure. Basically, the methods include forming a material stack including blanket layers of passivation material and sacrificial material on a surface of a crystalline semiconductor material. A first contact opening is then formed into the blanker layer of sacrificial material by lithography, and thereafter the photoresist used in forming the first contact opening is removed. The first contact opening is extended into blanket layer of passivation material, stopping on a first surface portion of the crystalline semiconductor material, using remaining sacrificial material layer portions as an etch mask. The exposed first surface portion of the crystalline semiconductor material is then subjected to a hydrogen (H) termination process. In some embodiments, the etch chemistry used for etching the passivation material, as explained above, also provides H termination on the crystalline semiconductor surface and therefore an additional H termination step is not necessary. Next, a semiconductor material such as, for example, a-Si:H, is formed on the exposed first surface portion of the crystalline semiconductor material. In some embodiments, the methods also include forming an electrode material portion as a hard mask over the first contact opening, and depositing a second blanket layer of sacrificial material to protect the hard mask, followed by forming the next contact opening using the same approach as used for forming the first contact opening.

The term "crystalline" is used throughout the present disclosure to denote a single crystalline material, a multi-crystalline material or a polycrystalline material. Typically, the crystalline semiconductor material that is employed in the present disclosure is comprised of a single crystalline semiconductor material. The term "non-crystalline" is used throughout the present disclosure to denote an amorphous, nano-crystalline or micro-crystalline material. Typically, the non-crystalline semiconductor material that is employed in the present disclosure is amorphous. The term "intrinsic" is used throughout the present disclosure to denote a semiconductor material that contains no doping atoms therein or alternatively a semiconductor material in which the concentration of dopant atoms therein is less than $10^{15}$ atoms/cm$^3$. The term "hydrogenated" is used throughout the present disclosure to denote that a semiconductor material includes hydrogen therein.

Reference is first made to FIGS. 1-12 which illustrate a first embodiment of the present disclosure for forming semiconductor material contacts (p-type) and (n-type) on a same side of a crystalline semiconductor substrate. It should be noted that although the drawings and description that follows illustrate the formation of a single first contact opening, and a single second contact opening, the various methods of the present disclosure, including the one depicted in FIGS. 1-12, can be used to form any number of first contact openings (and subsequent first semiconductor contacts) and any number of second contact openings (and subsequent second semiconductor contacts).

Specifically, FIG. 1 illustrates an initial structure that can be employed in one embodiment of the present disclosure. The initial structure illustrated in FIG. 1 includes a crystalline semiconductor material 10 having a first side and a second side which is opposite the first side. A material stack of, from bottom to top, a blanket layer of passivation material 12 and a blanket layer of sacrificial material 14 is located on one of the sides of the crystalline semiconductor material 10. The blanket layer of passivation material 14 can also be referred to herein as a blanket layer of first sacrificial material. In some embodiments, and as illustrated, for example, in FIG. 1, the crystalline semiconductor material 10 is a bulk semiconductor substrate. In other embodiments of the present disclosure (not shown in FIG. 1, but illustrated in FIGS. 29A-29B), the crystalline semiconductor material 10 can be an uppermost semiconductor layer of a semiconductor-on-insulator layer in which at least an insulating layer is located beneath the uppermost semiconductor layer, i.e., the crystalline semiconductor material 10. In some embodiments, a handle substrate (not shown in FIG. 1, but illustrated in FIGS. 29A-29B) such as, for example, a semiconductor substrate, glass, plastic or metal foil can be located directly beneath the insulating layer. In embodiments where the handle substrate is insulating, a separate insulating layer is not needed since the insulating handle substrate can serve as the insulating material. In yet other embodiments, the crystalline semiconductor material may represent a topmost semiconductor layer of a multilayered semiconductor material stack.

In one embodiment, the crystalline semiconductor material 10 that can be employed in the present disclosure can be an III-V compound semiconductor which includes at least one element from Group IIIA (i.e., Group 13) of the Periodic Table of Elements and at least one element from Group VA (i.e., Group 15) of the Periodic Table of Elements. The range of possible formulae for suitable III-V compound semiconductors that can be used in the present disclosure is quite broad because these elements can form binary (two elements, e.g., gallium (III) arsenide (GaAs)), ternary (three elements, e.g., indium gallium arsenide (InGaAs)) and quaternary (four elements, e.g., aluminum gallium indium phosphide (AlInGaP)) alloys.

In another embodiment of the present disclosure, the crystalline semiconductor material 10 can be a semiconductor material having the formula $Si_yGe_{1-y}$ wherein y is $0 \le y \le 1$. In some embodiments, in which y is 1, the crystalline semiconductor material 10 can be comprised entirely of Si. In another embodiment, in which y is 0, the crystalline semiconductor material 10 can be comprised entirely of Ge. In yet another embodiment and when y is other than 0 or 1, the crystalline semiconductor material 10 can be comprised entirely of a SiGe alloy.

In yet another embodiment of the present disclosure, the crystalline semiconductor material 10 can be a semiconductor material comprised of SiC.

In some embodiments of the present disclosure, the crystalline semiconductor material 10 may include nitrogen, oxygen, fluorine, deuterium, chlorine or any combination thereof. When present, the concentration of the aforementioned species can be from 1 atomic % to 10 atomic percent. Other concentrations that are lesser than, or greater than, the aforementioned concentration range can also be present.

In some embodiments, and as shown in FIG. 1, the entirety of the crystalline semiconductor material 10 is of a first conductivity type, i.e., either p-type or n-type. As used herein, "p-type" refers to the addition of impurities to an intrinsic semiconductor that creates deficiencies of valence electrons (i.e., holes). In a Si-containing semiconductor material, examples of p-type dopants, i.e., impurities, include but are not limited to, boron, aluminum, gallium and indium. In one embodiment, in which the first conductivity type of the crystalline semiconductor material 10 of the present disclosure is p-type, the p-type dopant is present in a concentration ranging from $1 \times 10^9$ atoms/cm$^3$ to $1 \times 10^{20}$ atoms/cm$^3$. In another embodiment, in which the first conductivity type of the crystalline semiconductor material 10 of the present disclosure is p-type, the p-type dopant is present in a concentration ranging from $1 \times 10^{14}$ atoms/cm$^3$ to $1 \times 10^{19}$ atoms/cm$^3$. As used herein, "n-type" refers to the addition of impurities that contributes free electrons to an intrinsic semiconductor. In a Si-containing semiconductor, examples of n-type dopants, i.e., impurities, include but are not limited to, antimony, arsenic and phosphorous. In one embodiment, in which the first conductivity type of the crystalline semiconductor material 10 of the present disclosure is n-type, the n-type dopant is present in a concentration ranging from $1 \times 10^9$ atoms/cm$^3$ to $1 \times 10^{20}$ atoms/cm$^3$. In another embodiment, in which the first conductivity type of the crystalline semiconductor material 10 of the present disclosure is n-type, the n-type dopant is present in a concentration ranging from $1 \times 10^{14}$ atoms/cm$^3$ to $1 \times 10^{19}$.

The dopant concentration of the first conductivity type within the crystalline semiconductor material 10 of the present disclosure may be graded or uniform. By "uniform" it is meant that the dopant concentration of first conductivity type is the same throughout the entire thickness of the crystalline semiconductor material 10. For example, a crystalline semiconductor material 10 having a uniform dopant concentration of the first conductivity type may have the same dopant concentration at the upper surface and bottom surface of the semiconductor material, as well as the same dopant concentration at a central portion of the semiconductor material between the upper surface and the bottom surface of the crystalline semiconductor material 10. By "graded" it is meant that the dopant concentration of the first conductivity type varies throughout the thickness of the crystalline semiconductor material 10. For example, a crystalline semiconductor material 10 having a graded dopant concentration may have an upper surface with a greater dopant concentration of the first conductivity type than the bottom surface of the crystalline semiconductor material 10, and vice versa.

In some embodiments, the first conductivity type can be introduced during the growth of the crystalline semiconductor material that can be used as element 10 of the present disclosure. Alternatively, the conductivity type can be introduced into an intrinsic crystalline semiconductor material by utilizing ion implantation, and/or gas phase doping and the doped crystalline semiconductor material can be employed as the crystalline semiconductor material 10. The thickness of the crystalline semiconductor material 10 can be from 3 nm to 3 μm. Other thicknesses that are lesser than, or greater than, the aforementioned thickness range can also be employed for the thickness of the crystalline semiconductor material 10.

A blanket layer of a passivation material 12 is then formed on an entire surface of the crystalline semiconductor material 10. In some embodiments, and as illustrated in the drawings of the present disclosure, the blanket layer of passivation material 12 includes a single layer. In other embodiments, the blanket layer of passivation material 12 includes a multilayered structure containing various layers of passivation materials. The passivation material serves to saturate dangling bonds on the surface of the crystalline semiconductor material 10, in order to reduce the recombination of carriers at the surface of the crystalline semiconductor material 10. The passivation material may also reduce the recombination of carriers at the surface of the crystalline semiconductor material 10 by "field-induced" passivation, for example by repelling the minority carriers from the surface of the crystalline semiconductor material 10. Field-induced passivation may be facilitated by the presence of fixed electronic charges in the passivation layer, formation of dipoles at the passivation/substrate interface, or the electric field induced by the workfunction difference between the passivation layer and the substrate semiconductor material. The passivation material may also serve to prevent air or moisture from being introduced into the crystalline semiconductor material 10.

The passivation material that can be employed in the present disclosure includes, for example, a hard mask material such as, for example, a semiconductor oxide, a semiconductor nitride, a semiconductor oxynitride, or a multilayered stack thereof. The passivation material may also be comprised of a high-k dielectric (k>silicon oxide) such as aluminum oxide or hafnium oxide. In some embodiments, which is more typical to III-V materials, the passivation material may be comprised of a substantially undoped semiconductor material having a larger band gap than that of the crystalline semiconductor material 10 to passivate the surface of the crystalline semiconductor material 10 by repelling the minority carriers induced by workfunction difference between the semiconductor materials formed by the passivation material and the crystalline semiconductor material 10.

Examples of passivation material that can be used as the blanket layer of passivation material 12 include, but not limited to, hydrogenated amorphous silicon nitride (a-SiN$_x$:H), hydrogenated amorphous silicon oxide (a-SiO$_x$:H), hydrogenated amorphous silicon oxynitride (a-SiN$_x$O$_y$:H), aluminum oxide (Al$_2$O$_3$) and hafnium-oxide (HfO$_2$). Nano-crystalline and microcrystalline forms of hydrogenated materials such as SiO$_x$, SiN$_x$ and SiN$_x$O$_y$ may also be used. The blanket layer of passivation material 12 can have a thickness from 5 nm to 50 nm. Other thicknesses that are below or above the aforementioned thickness range can also be employed.

In one embodiment, the blanket layer of passivation material 12 can be formed by a deposition process including, for example, chemical vapor deposition, plasma enhanced chemical vapor deposition, atomic layer deposition or chemical solution. In other embodiments, the blanket layer of passivation material 12 can be formed utilizing a thermal technique such as, for example, oxidation and/or nitridation. In yet other embodiments, a combination of a deposition process and a thermal technique can be used to form the blanket layer of passivation material 12. In still another embodiment, which is more typical to III-V materials, a substantially undoped semiconductor material having a larger band gap than that of the crystalline semiconductor material 10 can be used as the blanket layer of passivation material 12 and such a material can be grown on the crystalline semiconductor material 10 by conventional growth techniques such as, for example, molecular beam epitaxy or metal-organic chemical vapor deposition. Hydrogen may be included in some of the above mentioned processes to form a passivation material that is hydrogenated. In one embodiment in which hydrogen is present in the passivation material, the hydrogen content within the passivation material may range from 5 atomic % to 40 atomic %. The blanket layer of passivation material 12 that is formed at this stage of the present disclosure is a contiguous layer.

Next, a blanket layer of sacrificial material 14 is formed on an exposed topmost surface of the blanket layer of passivation material 12. In some embodiments, and as illustrated in the drawings of the present disclosure, the blanket layer of sacrificial material 14 includes a single layer. In other embodiments, the blanket layer of sacrificial material 14 includes a multilayered structure containing various layers of sacrificial materials. As shown, the blanket layer of sacrificial material 14 is a contiguous layer that is present on the entire topmost surface of the blanket layer of passivation material 12.

The blanket layer of sacrificial material 14 that is employed in the present disclosure includes a layer (or layers) of semiconducting material (or materials), which is (are) substantially resistive to dilute HF. Resistance against dilute HF for a given material is a relative term and depends on the concentration of HF solution and exposure time to HF, as well as the thickness of the material being used. For most substrate materials, typically a 1:100 HF solution (1:100 refers to the volume ratio of HF to de-ionized water) is used for hydrogen termination and the exposure time to dilute HF is typically in the range of 30 seconds to 5 minutes; however, as known in the art, longer or shorter times may be used as well. Also, higher or lower concentrations of HF may be used.

Substantial resistance against HF indicates that the sacrificial material serves as barrier against HF preventing HF from reaching the underlying passivation material which is typically soluble in HF. Examples of semiconductor materials that can be used as the blanket layer of sacrificial material 14 include, but are not limited to, a-Si:H, a-SiC:H, a-SiGe:H or combinations thereof; throughout the present disclosure, the symbol "a" denotes amorphous and the symbol "H" denotes hydrogenated. The content of hydrogen within the sacrificial material may vary, but a typically range of hydrogen within the sacrificial material is from 5 atomic % to 40 atomic % hydrogen. Nanocrystalline and microcrystalline forms of these materials may also be used. Combinations or stacks of these materials may be used as the blanket layer of sacrificial material 14. Typically Si and SiC based materials are preferred over Ge and SiGe based materials. For example, a 3-5 nm (or thicker) layer of a-Si:H or a-SiC:H is typically substantially resistant against 1:100 dilute HF for exposure times in the range of 30 seconds to 5 minutes.

The blanket layer of sacrificial material 14 can have a thickness from 5 nm to 50 nm. Other thicknesses that are below or above the aforementioned thickness range can also be employed.

The blanket layer of sacrificial material 14 is typically non-doped and can be formed by conventional deposition processes. In one embodiment, the blanket layer of sacrificial material 14 can be formed by plasma enhanced chemical vapor deposition (PECVD). In other embodiments, a hot-wire chemical vapor deposition (HWCVD) process can be used in forming the blanket layer of sacrificial material 14. In yet another embodiment, sputtering can be used in forming the blanket layer of sacrificial material 14. The blanket layer of sacrificial material 14 can be formed using conditions, source gases and other gases that are well known to those skilled in the art including those that will be mentioned in greater detail herein below in forming the first and second semiconductor contact materials.

Figure 2:
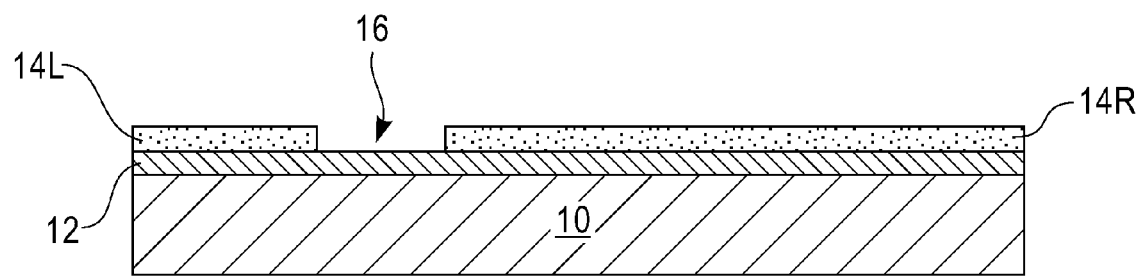
FIG. 2 is a pictorial representation (through a cross sectional view) illustrating the structure of FIG. 1 after patterning the blanket layer of sacrificial material to include a first contact opening that exposes a surface of the blanket layer of passivation material.

Referring now to FIG. 2, there is illustrated the structure of FIG. 1 after patterning the blanket layer of sacrificial material 14 to include a first contact opening 16 that exposes a surface of the blanket layer of passivation material 12. The remaining portions of the blanket layer of sacrificial material 14, which can be herein after referred to as sacrificial material layer portions, are designated as 14L, 14R in the drawings of the present application. 14L, 14R may also be referred to as first patterned sacrificial material layer portions.

The patterning of the blanket layer of sacrificial material 14 is performed utilizing lithography and etching. Lithography includes forming a photoresist material (not shown) on an exposed surface of the blanket layer of sacrificial material 14, exposing the photoresist material to a desired pattern of radiation, and developing the photoresist material utilizing a conventional resist developer. The desired pattern that is formed into the photoresist material can be in the form of a via or a trench. The etching step, which transfers the pattern from the patterned photoresist into the blanket layer of sacrificial material 14, can include dry etching (i.e., reactive ion etching, ion beam etching, or plasma etching), wet chemical etching, or a combination thereof. In one embodiment of the present disclosure a selective etch process (typically a dry etch) is used to pattern the blanket layer of sacrificial material 14. For example, plasma chemistry based on $SF_6$, $SF_6/O_2$ or $SF_6/CCl_2F_2$ may be used for reactive ion etching. The etch rate of the blanket layer of sacrificial material 14 is typically higher than that of the blanket layer of passivation material 12 in such plasmas. Alternatively, an etch process (e.g., based on $CF_4$) which is not selective may also be used by controlling the etch time. After pattern transfer, the patterned photoresist is typically removed from the structure utilizing a conventional stripping process such as, for example, ashing.

In some embodiments, the width of the first contact opening 16 that is formed is in the range of 10 nm to 100 nm. In other embodiments, the width of the first contact opening 16 that is formed is in the range of 50 nm to 1 µm. In yet other embodiments, the width of the first contact opening 16 that is formed is in the range of 500 nm to 100 µm. A first contact opening 16 having a width narrower than 10 nm or wider than 100 µm can also be employed.

Figure 3:
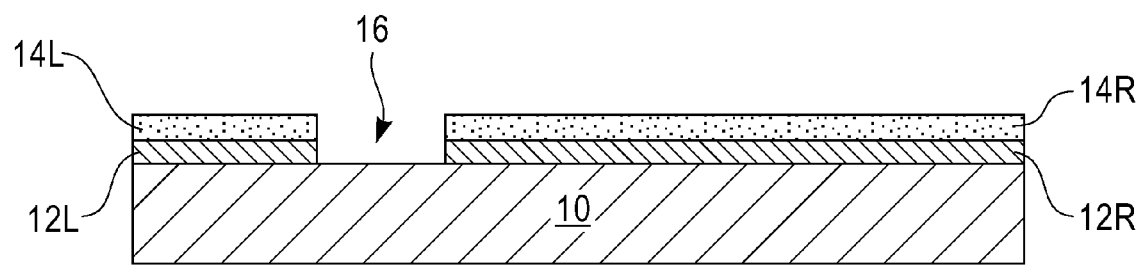
FIG. 3 is a pictorial representation (through a cross sectional view) illustrating the structure of FIG. 2 after transferring the first contact opening into the blanket layer of passivation material using remaining portions of the blanket layer of sacrificial material as an etch mask, wherein after the transferring of the first contact opening into the blanket layer of passivation material a first surface portion of the crystalline semiconductor material is exposed.

Referring to FIG. 3, there is illustrated the structure of FIG. 2 after transferring the first contact opening 16 into the blanket layer of passivation material 12 using remaining portions of the blanket layer of sacrificial material, i.e., the sacrificial material layer portions 14L, 14R, as an etch mask. After the transferring of the first contact opening 16 into the blanket layer of passivation material 12, a first surface portion of the crystalline semiconductor material 10 is exposed. The remaining portions of the blanket layer of passivation material 12, which can be herein after referred to as passivation material layer portions, are designated as 12L, 12R in the drawings of the present application. 12L, 12R may also be referred to as first patterned passivation material layer portions.

The transferring of the first contact opening 16 into the blanket layer of passivation material 12 includes an etching process which is selective for removing the exposed portions of the blanket layer of passivation material 12 as compared with the overlying sacrificial material layer portions 14L, 14R. The etch used in transferring the first contact opening 16 can include dry etching (i.e., reactive ion etching, ion beam etching, or plasma etching), wet chemical etching, or a combination thereof. Typically, dilute HF is used for transferring the first contact opening 16 into the blanket layer of passivation material 12. In some embodiments, the dilute HF may include a sufficiently long over-etch time so that the exposed first surface portion of the crystalline semiconductor material 10 is hydrogen terminated and ready for the deposition of the semiconductor contact material. Other processes/materials may be used for etching the blanket layer of passivation material 12 (selectively against the remaining sacrificial material layer portions 14L, 14R), followed by exposing the first surface portion of the crystalline semiconductor material 10 to dilute HF for hydrogen termination. Also, other techniques know in the art may be used for hydrogen termination instead of dilute HF, or in addition to (for example following or preceding) dilute HF for enhanced hydrogen termination.

Figure 4:
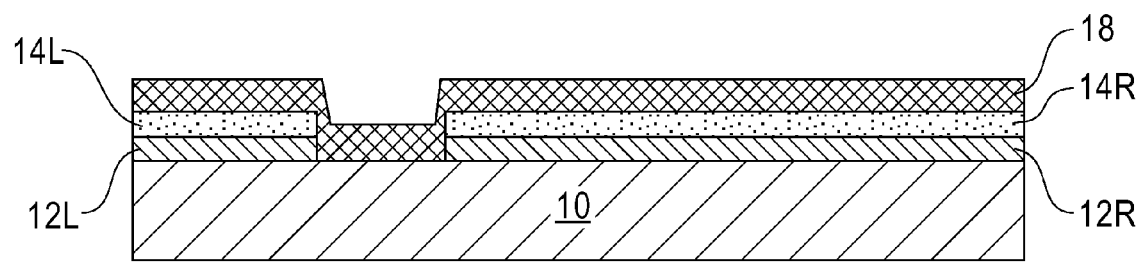
FIG. 4 is a pictorial representation (through a cross sectional view) illustrating the structure of FIG. 3 after forming at least one first semiconductor material on the first surface portion of the crystalline semiconductor material and atop remaining portions of the blanket layer of sacrificial material.

Referring now to FIG. 4, there is illustrated the structure of FIG. 3 after forming at least one first semiconductor material 18 on the first surface portion of the crystalline semiconductor material 10 and atop remaining portions of the blanket layer of sacrificial material, i.e., sacrificial material layer portions 14L, 14R.

In one embodiment, the at least one first semiconductor material 18 is a single layer of semiconductor material. In another embodiment, the at least one first semiconductor material 18 can be a multilayered structure comprises at least two layers of the same or different semiconductor materials. When a single semiconductor material layer is employed, the at least one first semiconductor material 18 is doped to have a conductivity type, e.g., p-type or n-type, that is the same or different from that of the crystalline semiconductor material 10 in which contact is made. When a multilayered structure is employed, the at least one first semiconductor material may comprise semiconductor materials that are all doped, or some that are doped and some that are intrinsic. When doped, the semiconductor material layers of the multilayered structure have a conductivity type that is the same or different from that of the crystalline semiconductor material 10. By way of example, the first semiconductor material 18 may comprise a stack of, from bottom to top, an intrinsic semiconductor material and a doped semiconductor material; a stack of, from bottom to top, a doped semiconductor material, and another doped semiconductor material each of the same conductivity and comprising a same semiconductor material; or a stack of, from bottom to top, a doped semiconductor material, and another doped semiconductor material each of the same conductivity and comprising different semiconductor materials. The semiconductor materials within a multilayered stack which can be used as the at least one first semiconductor material 18 may have different band gaps from each other.

The at least one first semiconductor material 18 may be crystalline, non-crystalline or a combination of crystalline and non-crystalline. In some embodiments, a single layer of first semiconductor material 18 can be formed that comprises a crystalline semiconductor portion and adjoining non-crystalline semiconductor material portions. In such an embodiment, the single crystalline portion is formed in direct contact with the first surface portion of the crystalline semiconductor material 10 and the adjoining non-crystalline portions are present on the uppermost surface of the remaining portions of the sacrificial material layer portions 14L, 14R.

The at least one first semiconductor material 18 can be hydrogenated, non-hydrogenated or, if a multilayered stack is used the various semiconductor materials within the multilayered stack can be hydrogenated, non-hydrogenated or a combination of hydrogenated and non-hydrogenated. In one embodiment in which at least one of the semiconductor material layers of the at least one first semiconductor material 18 is hydrogenated, the hydrogenated semiconductor material may contain from 5 atomic % to 40 atomic % hydrogen therein. In another embodiment in which at least one of the semiconductor material layers of the at least one first semiconductor material 18 is hydrogenated, the hydrogenated semiconductor material may contain from 10 atomic % to 25 atomic % hydrogen therein. In yet another embodiment in which the at least one of the semiconductor material layers of the at least one first semiconductor material 18 is hydrogenated, the hydrogenated semiconductor material may contain from 20 atomic % to 30 atomic % hydrogen therein.

The at least one first semiconductor material 18 may comprise a same and/or different semiconductor material(s) as that of the crystalline semiconductor material 10. In one embodiment, the at least one first semiconductor material 18 has a formula $Si_xGe_{1-x}$ wherein x is $0 \leq x \leq 1$. As such, the at least one first semiconductor material 18 may comprise Si (when x is 1), Ge (when x is 0), or a SiGe (when x is other than 1, or 0).

In some embodiments of the present disclosure, the at least one first semiconductor material 18 can contain C therein. When present, C can be present in a concentration from 0 atomic % to 50 atomic %. In some embodiments, the at least one first semiconductor material 18 can contain from 0 atomic % to 25 atomic % carbon therein. The carbon impurity can be added by way of either a source gas that includes carbon, or by introducing a carbon source gas into the gas mixture that is employed in the present disclosure for forming the at least one first semiconductor material 18.

In some embodiments of the present disclosure, the at least one first semiconductor material 18 may include nitrogen, oxygen, fluorine, deuterium, chlorine or any combination thereof. When present, the concentration of the aforementioned species can be from 1 atomic % to 10 atomic percent. Other concentrations that are lesser than, or greater than, the aforementioned concentration range can also be present.

When at least one of the semiconductor material layers of the least one first semiconductor material 18 is doped, the dopant that is contained within the at least one semiconductor material layers can be a p-type dopant or an n-type dopant. The dopant within each semiconductor layer of the at least one semiconductor material 18 can be uniformly present or present as a gradient. In a Si-containing doped semiconductor material examples of p-type dopants, i.e., impurities, include but are not limited to, boron, aluminum, gallium and indium. In one embodiment, in which at least one of semiconductor material layers of the at least one first semiconductor material 18 includes a p-type dopant, the p-type dopant is present in a concentration ranging from $10^{16}$ atoms/cm$^3$ to $10^{21}$ atoms/cm$^3$. In another embodiment, in which at least one of semiconductor material layers of the at least one first semiconductor material 18 contains a p-type dopant, the p-type dopant is present in a concentration ranging from $10^{18}$ atoms/cm$^3$ to $5 \times 10^{20}$ atoms/cm$^3$.

In a Si-containing doped semiconductor material, examples of n-type dopants, i.e., impurities, include but are not limited to, antimony, arsenic and phosphorous. In one embodiment, in which at least one of semiconductor material layers of the at least one first semiconductor material 18 contains an n-type dopant, the n-type dopant is present in a concentration ranging from $10^{16}$ atoms/cm$^3$ to $10^{21}$ atoms/cm$^3$. In another embodiment, in which the at least one of semiconductor material layers of the at least one first semiconductor material 18 contains an n-type dopant, the n-type dopant is present in a concentration ranging from $10^{18}$ atoms/$cm^3$ to $5 \times 10^{20}$ atoms/$cm^3$.

In one embodiment, the at least one first semiconductor material 18 can be formed by plasma enhanced chemical vapor deposition (PECVD). PECVD is a deposition process used to deposit films from a gas state (vapor) to a solid state on a deposition substrate. Chemical reactions are involved in the process, which occur after creation of a plasma of the reacting gases. A plasma is any gas in which a significant percentage of the atoms or molecules are ionized. Fractional ionization in plasmas used for deposition and related materials processing varies from about $10^{-4}$ in capacitive discharge plasmas to as high as 5-10% in high density inductive plasmas. Processing plasmas are typically operated at pressures of a few millitorr to a few torr, although arc discharges and inductive plasmas can be ignited at atmospheric pressure. In some embodiments, the plasma is created by RF (AC) frequency, such as a radio frequency induced glow charge, or DC discharge between two electrodes, the space between which is filled with the reacting gases. In one example, a PECVD device employs a parallel plate chamber configuration. In other embodiments, a hot-wire chemical vapor deposition (HWCVD) process can be used in forming the at least one first semiconductor material 18. In yet another embodiment, sputtering can be used in forming the at least one first semiconductor material 18.

In some embodiments, the at least one first semiconductor material 18 can be formed at a temperature close to 200° C., with highest quality films typically grown at temperatures in the range of 150° C.-250° C., however temperatures in the range from room-temperature (i.e., 20° C.) up to 450° C. may be used.

In other embodiments in which the at least one first semiconductor material 18 includes a semiconductor material comprising a crystalline semiconductor portion and adjoining non-crystalline semiconductor portions, the semiconductor material, which includes the crystalline semiconductor portion and adjoining non-crystalline semiconductor portions, can be epitaxially grown at a temperature of less than 500° C. using a gas mixture that includes a source gas, optionally hydrogen and a dopant gas. The lower temperature limit for the epitaxial growth of such a semiconductor material is generally 100° C. In some embodiments, the semiconductor material, which includes the crystalline semiconductor portion and adjoining non-crystalline semiconductor portions, can be epitaxially grown at a temperature from 150° C. to 300° C. In other embodiments, the semiconductor material, which includes the crystalline semiconductor portion and adjoining non-crystalline semiconductor portions, from 150° C. to 250° C.

In one embodiment in which a semiconductor material, which includes a crystalline semiconductor portion and adjoining non-crystalline semiconductor portions, is formed, such a layer can be formed by PECVD. In some embodiments, the pressure for the PECVD process that can be used for epitaxially growing the semiconductor material, which includes the crystalline semiconductor portion and adjoining non-crystalline semiconductor portions, can range from 10 mTorr to 5 Torr, and in one example may be in the range of 250 mtorr to 900 mTorr. The power density for the PECVD process for epitaxially growing the doped hydrogenated semiconductor material layer may range from 1 mW/$cm^2$ to 100 mW/$cm^2$, and in one example may be in the range of 3 mW/$cm^2$ to 10 mW/$cm^2$. Further details regarding the epitaxial growth process for forming the semiconductor material, which includes the crystalline semiconductor portion and adjoining non-crystalline semiconductor portions, of the present disclosure are described in U.S. Patent Publication No. 2012/0210932, which is owned by the assignee of the present disclosure, and is incorporated herein by reference.

In any of the methods mentioned above, the source gas that can be used to form the at least one first semiconductor material 18 may comprise a Si-containing precursor, such as, for example, a silane and a disilane and/or a germanium-containing precursor such as, for example, a germane, $GeH_4$. In some embodiments, Si-containing and Ge-containing precursors can be used in forming the doped hydrogenated semiconductor material layer. Other gases including a carbon source such as, for example, $CH_4$ may be used. In some embodiments, ammonia ($NH_3$), nitrous oxide ($N_2O$) or other gas sources may be used for nitrogen containing semiconductor material layers. Carbon dioxide ($CO_2$), $N_2O$ or $O_2$ may be used to provide oxygen for oxygen containing semiconductor material layers. A carrier gas such as hydrogen ($H_2$), deuterium ($D_2$) helium (He) or argon (Ar) may be used for any or all of the layers. The carrier gas may be pre-mixed with the gas sources or flowed simultaneously with the gas source at the time of growth.

In one embodiment, a gas mixture including a ratio of hydrogen to source gas of from greater than 5:1 can be used. In another embodiment, the ratio of hydrogen to source gas that can be used ranges from 5:1 to 1000:1. For example, epitaxial growth of silicon is possible at temperatures as low as 150° C. with ratios of hydrogen to silane ($SiH_4$) ranging from 5:1 to 20:1.

The dopant gas that can be present during the formation of at least one semiconductor material layer within the at least one first semiconductor material 18 provides the conductivity type, either n-type or p-type, to the at least one semiconductor material. When a doped semiconductor material layer of an n-type conductivity is to be formed, the dopant gas includes at least one n-type dopant, e.g., phosphorus or arsenic. For example, when phosphorus is the n-type dopant, the dopant gas can be phosphine ($PH_3$), and when arsenic is the n-type dopant, the dopant gas can be arsine ($AsH_3$). In one example, when the conductivity type dopant is n-type, the dopant gas include phosphine gas ($PH_3$) present in a ratio to silane ($SiH_4$) ranging from 0.01% to 10%. In another example, when the conductivity type dopant is n-type, the dopant gas include phosphine gas ($PH_3$) present in a ratio to silane ($SiH_4$) ranging from 0.1% to 2%. When a semiconductor material layer of a p-type conductivity is to be formed, a dopant gas including at least one p-type dopant, e.g., B, is employed. For example, when boron is the p-type dopant, the dopant gas can be diborane ($B_2H_6$). In one embodiment, wherein the conductivity type dopant is p-type, the dopant gas may be diborane ($B_2H_6$) present in a ratio to silane ($SiH_4$) ranging from 0.01% to 10%. In another embodiment, wherein the conductivity type dopant is p-type, the dopant gas may be diborane ($B_2H_6$) present in a ratio to silane ($SiH_4$) ranging from 0.1% to 2%. In yet another embodiment, in which the conductivity type dopant is p-type, the dopant gas for may be trimethylboron (TMB) present in a ratio to silane ($SiH_4$) ranging from 0.1% to 10%.

Examples of the semiconducting material layers that can be used as the at least one first semiconductor material 18 include, but not limited to, a-Si:H, a-Ge:H, a-SiGe:H, a-SiC:H, a-SiO:H, a-SiN:H, nc-Si:H, nc-Ge:H, nc-SiGe:H, nc-SiC:H, nc-SiO:H, nc-SiN:H, μc-Si:H, μc-Ge:H, μc-SiGe:H, μc-SiC:H, μc-SiO:H, μc-SiN:H or combinations thereof; nc- and μc-stand for nano-crystalline and micro-crystalline, respectively, "a" stands for amorphous, and "H" stands for hydrogenated.

Figure 5:
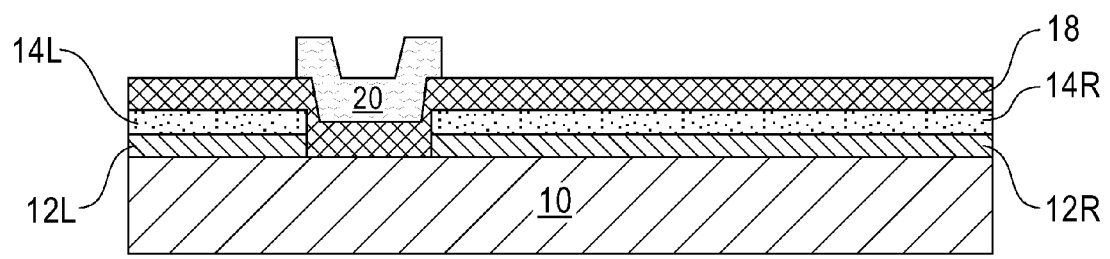
FIG. 5 is a pictorial representation (through a cross sectional view) illustrating the structure of FIG. 4 after forming a first electrode material portion on an uppermost surface of the at least one first semiconductor material and atop the first contact opening.

Referring now to FIG. 5, there is illustrated the structure of FIG. 4 after forming a first electrode material portion 20 on an uppermost surface of the at least one first semiconductor material 18 and atop the first contact opening 16. The first electrode material portion 20 can be comprised of a conductive material including, for example, a doped Si-containing material, a conductive metal, a conductive metal alloy comprising at least two conductive metals, a conductive metal nitride, a transparent conductive oxide and/or a conductive metal silicide. Examples of conductive metals that can be used include, for example, Cu, W, Pt, Al, Pd, Ru, Ni, and Ir. The first electrode material portion 20 can have a thickness from 1 nm to 1000 nm. Other thicknesses that are lesser than, or greater than, the aforementioned thickness range can also be employed as the thickness for the first electrode material portion 20.

In some embodiments, the first electrode material portion 20 can be formed using a deposition process including, for example, chemical vapor deposition, plasma enhanced chemical vapor deposition, sputtering, chemical solution deposition, or plating. Metal silicides can be formed utilizing any conventional silicidation process that is well known to those skilled in the art. In some embodiments, the conductive material can be patterned by lithography and etching as described hereinabove.

Figure 6:
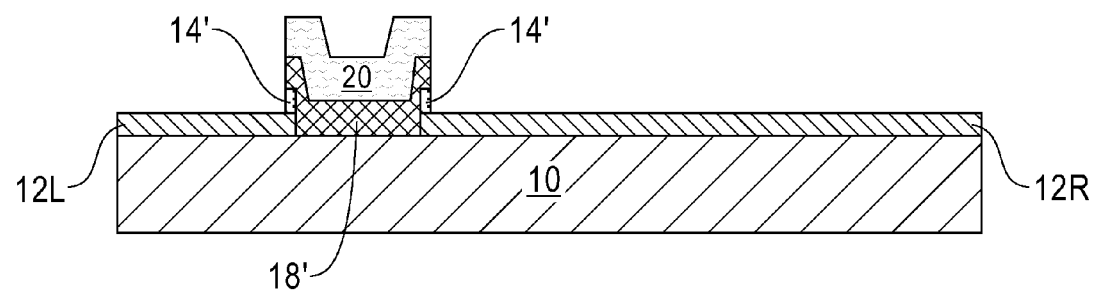
FIG. 6 is a pictorial representation (through a cross sectional view) illustrating the structure of FIG. 5 after removing exposed portions of the at least one first semiconductor material and remaining portions of the blanket layer of sacrificial material using the first electrode material portion as an etch mask.

Referring now to FIG. 6, there is illustrated the structure of FIG. 5 after removing exposed portions of the at least one first semiconductor material 18 and remaining portions of the blanket layer of sacrificial material 14L, 14R using the first electrode material portion 20 as an etch mask. In the drawing, the remaining portion of the at least first semiconductor material 18 can be referred to as first semiconductor material contact 18'. As shown, some of the sacrificial material remains between a portion of the first electrode material portion 20 and the first semiconductor material contact 18'. This portion of the sacrificial material that remains can be referred to herein as a sacrificial material portion 14'.

In one embodiment, the exposed portions of the at least one first semiconductor material 18 and underlying remaining portions of the blanket layer of sacrificial material 14L, 14R which are not protected by the first electrode material portion 20, can be removed utilizing a single etch. In another embodiment, two separate etching steps can be used to remove the exposed portions of the at least one first semiconductor material 18 and underlying remaining portions of the blanket layer of sacrificial material 14L, 14R which are not protected by the first electrode material portion 20.

The etch or etches that can be used in this step of the present disclosure may include for example, a dry etch process such as, for example, reactive ion etching, plasma etching or ion beam etching. Alternatively, a chemical wet etch can be employed. In one embodiment, the exposed portions of the at least one first semiconductor material 18 and underlying remaining portions of the blanket layer of sacrificial material 14L, 14R which are not protected by the first electrode material portion 20 can be removed by $SF_6$, $SF_6/O_2$ or $CCl_2F_2/O_2$ plasma.

Figure 7:
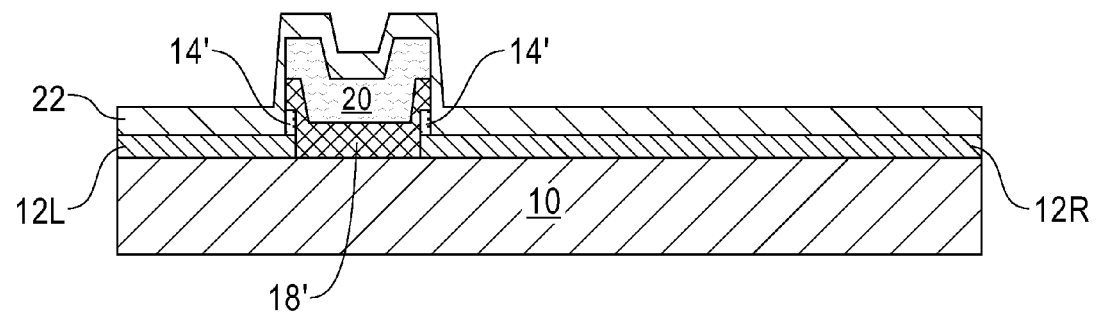
FIG. 7 is a pictorial representation (through a cross sectional view) illustrating the structure of FIG. 6 after forming another blanket layer of sacrificial material on exposed surfaces of remaining portions of the blanket layer of passivation material and the first electrode material portion.

Referring now to FIG. 7, there is illustrated the structure of FIG. 6 after forming another blanket layer of sacrificial material 22 on exposed surfaces of the remaining portions of the blanket layer of passivation material 12L, 12R and the first electrode material portion 20. The another blanket layer of passivation material 22 can also be referred to herein as a second blanket layer of second sacrificial material. The another blanket layer of sacrificial material 22 can include one of the semiconductor materials mentioned above for the blanket layer of sacrificial material 14. Also, one of the techniques mentioned above in forming the blanket layer of sacrificial material 14 can also be used in forming the another blanket layer of sacrificial material 22.

Figure 8:
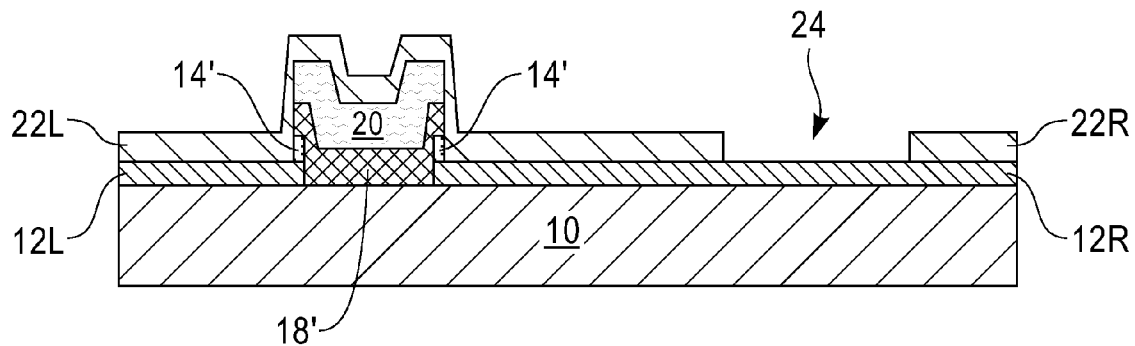
FIG. 8 is a pictorial representation (through a cross sectional view) illustrating the structure of FIG. 7 after patterning the another blanket layer of sacrificial material to include a second contact opening that exposes a surface of one of the remaining passivation material layer portions.

Referring now to FIG. 8, there is illustrated the structure of FIG. 7 after patterning the another blanket layer of sacrificial material 22 to include a second contact opening 24 that exposes a surface portion of one of the remaining passivation material layer portions 12L, 12R. In the drawings, and by way of an example, portion 12R is exposed. The remaining portions of the another blanket layer of sacrificial material 22 can be referred to herein as other sacrificial material layer portions 22L, 22R. The patterning of the another blanket layer of sacrificial material to include the second contact opening 24 includes the same technique as mentioned above in patterning the blanket layer of sacrificial material 14 to include the first contact opening 16. The second contact opening 24 can have a dimension, i.e., width, within the range mentioned above for the first contact opening 16.

Figure 9:
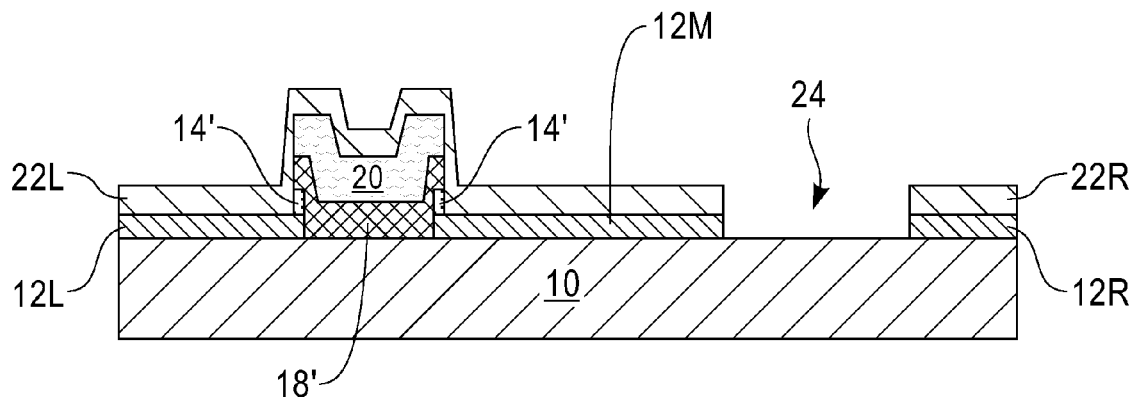
FIG. 9 is a pictorial representation (through a cross sectional view) illustrating the structure of FIG. 8 after transferring the second contact opening into the exposed remaining passivation material layer portion using the remaining portions of the another blanket layer of sacrificial material as an etch mask, wherein after the transferring of the second contact opening, a second surface portion of the crystalline semiconductor material is exposed.

Referring now to FIG. 9, there is illustrated the structure of FIG. 8 after transferring the second contact opening 24 into one of the remaining passivation material layer portions 12L, 12R using remaining portions of the another blanket layer of sacrificial material (i.e., the other sacrificial material layer portions 22L, 22R) as an etch mask. The pattern transfer of the second contact opening 24 can be performed utilizing the same techniques (i.e., etching) as mentioned above in transferring the first contact opening 16 into the blanket layer of passivation material 12. After the transferring of the second contact opening 24, a second surface portion of the crystalline semiconductor material 10 is exposed. In the drawings, reference 12M denotes another remaining passivation material layer portion that can form after exposing the second surface portion of the crystalline semiconductor material 10.

Figure 10:
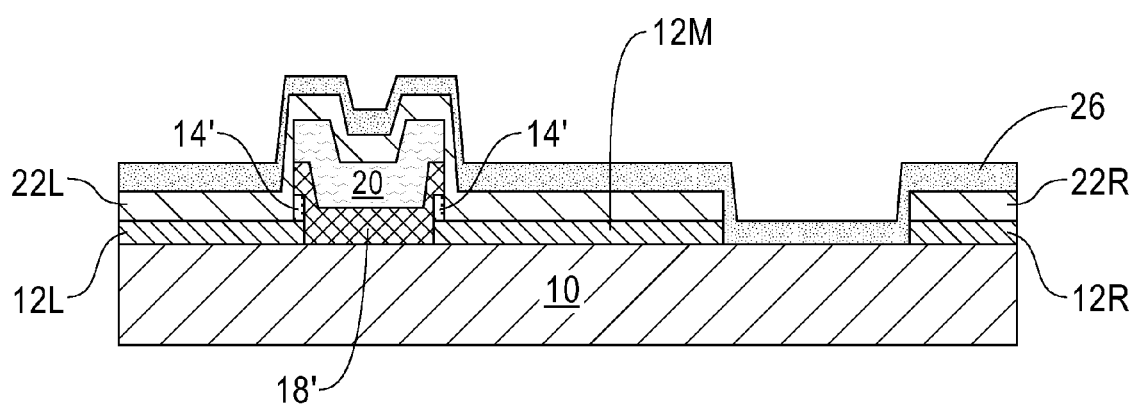
FIG. 10 is a pictorial representation (through a cross sectional view) illustrating the structure of FIG. 9 after forming at least one second semiconductor material on the second surface portion of the crystalline semiconductor material and atop remaining portions of the other blanket layer of sacrificial material.

Referring now to FIG. 10, there is illustrated the structure of FIG. 9 after forming at least one second semiconductor material 26 on the second surface portion of the crystalline semiconductor material 10 and atop remaining portions of the other blanket layer of sacrificial material 22L, 22R. The second semiconductor material 26 that can be employed in the present disclosure can include the same or different semiconductor material(s) and, any of the various embodiments, mentioned above for the first semiconductor material 18 so long as the conductivity of the second semiconductor material is opposite from the conductivity type used as the first semiconductor material 18. Hence, the first semiconductor material 18 can be used as n-type or p-type semiconductor contact, while the second semiconductor material 26 can be used as the other of a p-type or n-type semiconductor contact not used as the contact that includes the first semiconductor material 18.

Figure 11:
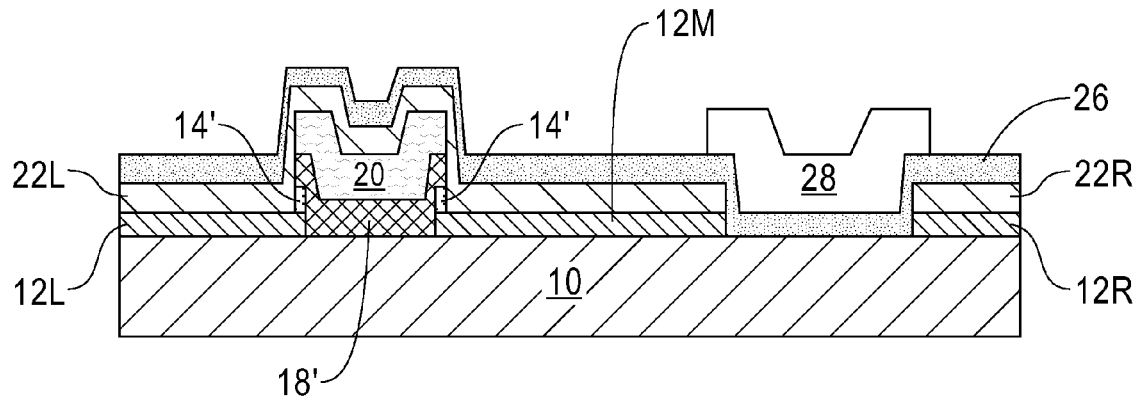
FIG. 11 is a pictorial representation (through a cross sectional view) illustrating the structure of FIG. 10 after forming a second electrode material portion on a surface of the at least one second semiconductor material and atop the second contact opening.

Referring now to FIG. 11, there is illustrated the structure of FIG. 10 after forming a second electrode material portion 28 on a surface of the at least one second semiconductor material 26 and atop the second contact opening 24. The second electrode material portion 28 may comprise one of the conductive materials mentioned above for the first electrode material portion. Also, one of the techniques mentioned above in forming the first electrode material portion can also be used here for forming the second electrode material portion.

Figure 12:
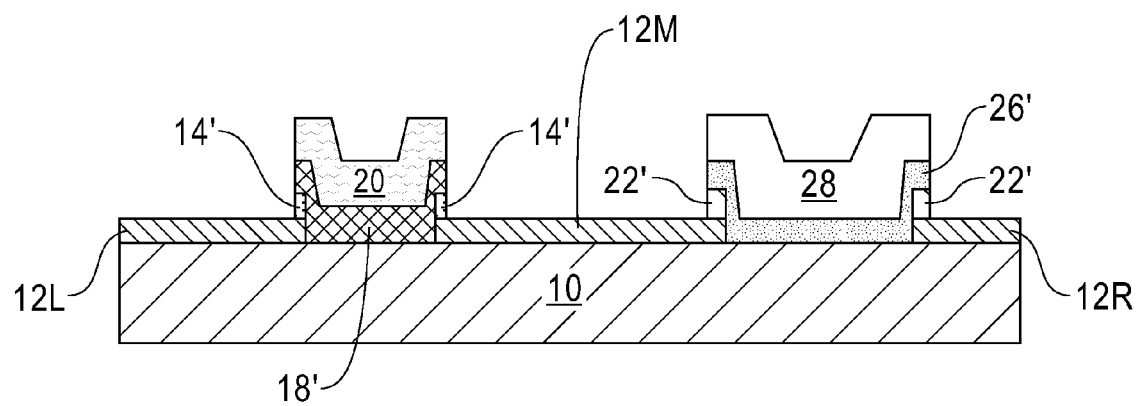
FIG. 12 is a pictorial representation (through a cross sectional view) illustrating the structure of FIG. 11 after removing exposed portions of the at least one second semiconductor material and remaining portions of the other blanket layer of sacrificial material using the second electrode material portion as an etch mask.

Referring now to FIG. 12, there is illustrated the structure of FIG. 11 after removing exposed portions of the at least one second semiconductor material 26 and remaining portions of the other blanket layer of sacrificial material 22L, 22R using the second electrode material portion 28 as an etch mask. In the drawing, the remaining portion of the at least one second semiconductor material 26 can be referred to as a second semiconductor material contact 26'. As shown, some of the other sacrificial material 22 remains between a portion of the second electrode material portion 28 and the second semiconductor material contact 26'. This portion of the other sacrificial material layer that remains can be referred to herein as a sacrificial material portion 22'.

In one embodiment, the exposed portions of the at least one second semiconductor material 26 and remaining portions of the blanket layer of other sacrificial material 22L, 22R which are not protected by the second electrode material portion 28, can be removed utilizing a single etch. In another embodiment, two separate etching steps can be used at this point of the present disclosure. The etch or etches that can be used in this step of the present disclosure may include for example, a dry etch process such as, for example, reactive ion etching, plasma etching or ion beam etching. Alternatively, a chemical wet etch can be employed. In one embodiment, an etch using $SF_6$, $SF_6/O_2$ or $CCl_2F_2/O_2$ plasma can be used.

It is noted that within FIG. 12, the remaining sacrificial material 14' is located between an outer portion of the first semiconductor material contact 18' and upper surfaces of the passivation material layer portions 12L, 12M. Also, the vertical edges of the elements 14', 18' and 20 are coincident with each other. It is noted that within FIG. 12, the remaining other sacrificial material 22' is located between an outer portion of the second semiconductor material contact 26' and upper surfaces of the passivation material layer portions 12M, 12R. Also, the vertical edges of the elements 22', 26' and 28 are coincident with each other.

Referring now to FIGS. 13-18, there is illustrated a second embodiment of the present disclosure for forming semiconductor material contacts (p-type) and (n-type) on a same side of a crystalline semiconductor substrate (p-type or n-type). It is noted that like and corresponding elements which were used in the first embodiment and can now be used within the second embodiment of the present disclosure have the same reference numerals.

Figure 13:
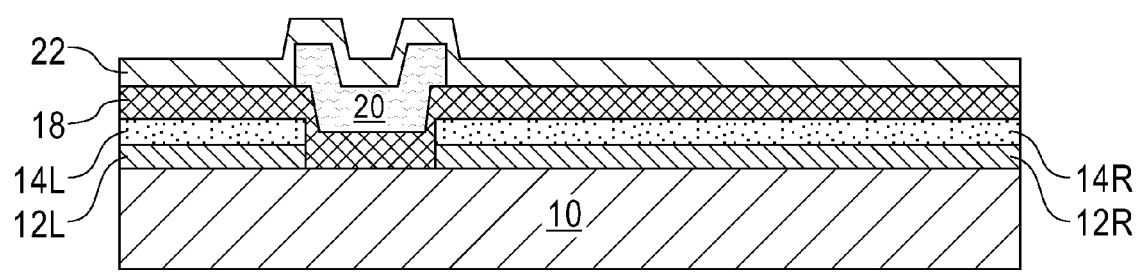
FIG. 13 is a pictorial representation (through a cross sectional view) illustrating the structure of FIG. 5 after forming another blanket layer of sacrificial material on exposed surfaces of the at least one first semiconductor material and the first electrode material portion in accordance with another embodiment of the present disclosure.

Referring first to FIG. 13, there is illustrated the structure of FIG. 5 after forming another blanket layer of sacrificial material 22 on exposed surfaces of the at least one first semiconductor material 18 and the first electrode material portion 20 in accordance with another embodiment of the present disclosure. The another blanket layer of sacrificial material 22 that is used in this embodiment is the same as that described above in conjunction with FIG. 7 of the first embodiment of the present disclosure.

Figure 14:
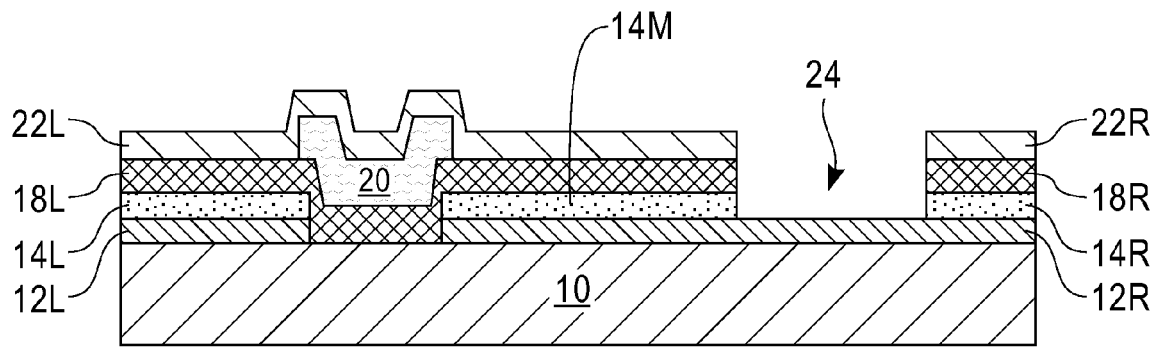
FIG. 14 is a pictorial representation (through a cross sectional view) illustrating the structure of FIG. 13 after forming a second contact opening within a portion of the another blanket layer of sacrificial material, a portion of at least one first semiconductor material, and a portion of one of the remaining sacrificial material layer portions which exposes one of the remaining passivation material layer portions.

Referring now to FIG. 14, there is illustrated the structure of FIG. 13 after forming a second contact opening 24 within a portion of the another blanket layer of sacrificial material 22, a portion of at least one first semiconductor material 18, and a portion of one of the remaining portions of the blanket layer of sacrificial material 14L, 14R which exposes one of the passivation material layer portions 12L, 12R. In the drawings, and by way of an example, 12R is exposed. The second contact opening 24 of this embodiment of the present disclosure can be formed by lithography and etching as described above for forming the second contact opening in the structure shown in FIG. 8 of the first embodiment of the present disclosure. In the drawing, reference numeral 14M denotes another remaining sacrificial material layer portion that can form after performing this step of the second embodiment of the present disclosure.

Figure 15:
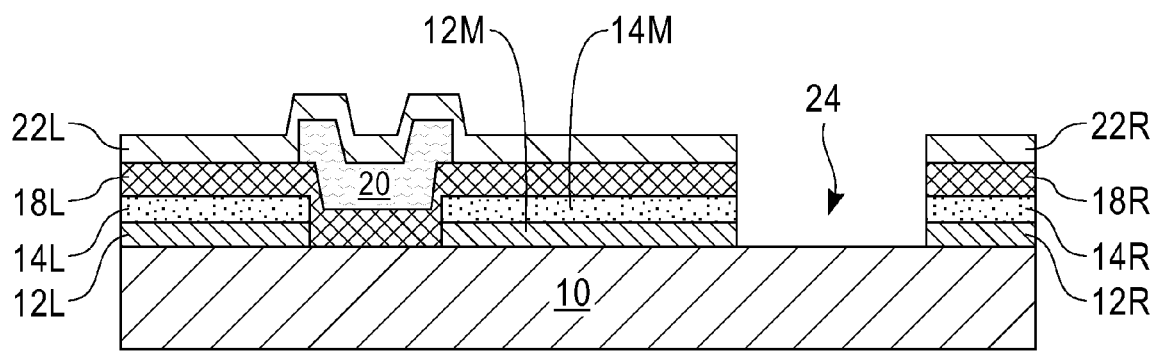
FIG. 15 is a pictorial representation (through a cross sectional view) illustrating the structure of FIG. 14 after transferring the second contact opening to the exposed remaining passivation material layer portion, wherein after the transferring of the second contact opening, a second surface portion of the crystalline semiconductor material is exposed.

Referring now to FIG. 15, there is illustrated the structure of FIG. 14 after transferring the second contact opening 24 to the exposed one passivation material layer portion (e.g., 12R) wherein after the transferring of the second contact opening 24, a second surface portion of the crystalline semiconductor material 10 is exposed. The transferring of the second contact opening 24 into one of the remaining passivation material layer portions (e.g., 12R) includes a same etch as mentioned above in forming the structure shown in FIG. 9 of the first embodiment of the present disclosure. In the drawing, reference numeral 12M denotes another remaining passivation material layer portion that can form after performing this step of the second embodiment of the present disclosure.

Figure 16:
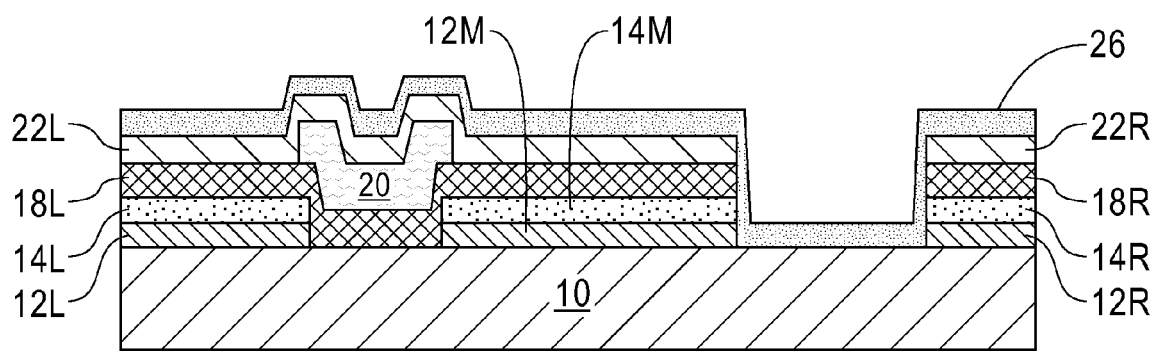
FIG. 16 is a pictorial representation (through a cross sectional view) illustrating the structure of FIG. 15 after forming at least one second semiconductor material on the second surface portion and remaining portions of the another blanket layer of sacrificial material.

Referring now to FIG. 16, there is illustrated the structure of FIG. 15 after forming at least one second semiconductor material 26 on the second surface portion of the crystalline semiconductor material 10 and remaining portions of the another blanket layer of sacrificial material 22L, 22R. The at least one second semiconductor material 26 used in this embodiment is the same as the at least one second semiconductor material used in forming the structure shown in FIG. 10 of the first embodiment of the present disclosure.

Figure 17:
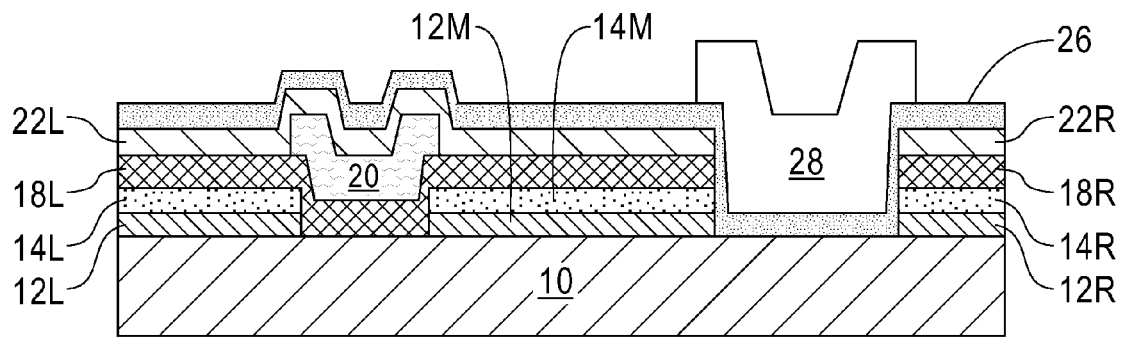
FIG. 17 is a pictorial representation (through a cross sectional view) illustrating the structure of FIG. 16 after forming a second electrode material portion.

Referring now to FIG. 17, there is illustrated the structure of FIG. 16 after forming a second electrode material portion 28 on topmost a surface of the at least one second semiconductor material and atop the second contact opening 24. In this embodiment, the etch stops on the remaining passivation material layer portions 12L, 12M and 12R. The second electrode material portion 28 used in this embodiment of the present disclosure is the same as that used in forming the structure shown in FIG. 11 of the first embodiment of the present disclosure.

Figure 18:
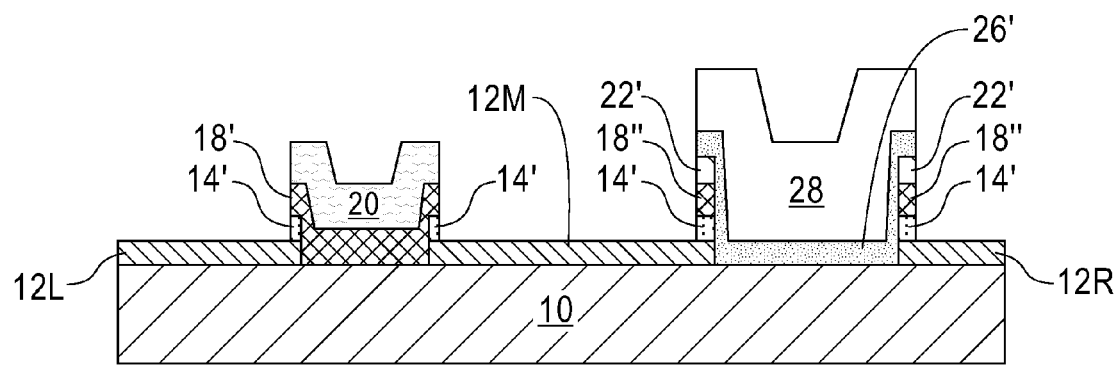
FIG. 18 is a pictorial representation (through a cross sectional view) illustrating the structure of FIG. 17 after etching using the second electrode material portion and the first electrode material portion as etch masks.

Referring now to FIG. 18, there is illustrated the structure of FIG. 17 after etching using the second electrode material portion 28 and the first electrode material portion 20 as etch masks. The etch used in this step of the present disclosure is the same as that used in forming the structure shown in FIG. 12 of the first embodiment of the present disclosure. In the drawings, reference numeral 26' denotes the second semiconductor material contact that is formed, reference numeral 22' denotes remaining portions of the another sacrificial material, reference 18" denotes remaining portions of the at least one first semiconductor material that remains under the second electrode material portion, and reference numeral 14' denotes remaining sacrificial material.

It is noted that within FIG. 18, the remaining sacrificial material 14' is located between an outer portion of the first semiconductor material contact 18' and upper surfaces of the passivation material layer portions 12L, 12M. Also, the vertical edges of the elements 14', 18' and 20 are coincident with each other. It is noted that within FIG. 18, the remaining other sacrificial material 22', remaining portions of the first semiconductor material 18", and the remaining portions of sacrificial material 14' are located between an outer portion of the second semiconductor material contact 26' and upper surfaces of the passivation material layer portions 12M, 12R. Also, the vertical edges of the elements 22', 26', 18", 14' and 28 are coincident with each other.

Reference is now made to FIGS. 19-24 which illustrate a third embodiment of the present disclosure for forming semiconductor material contacts (p-type) and (n-type) on a same side of a crystalline semiconductor substrate (p-type or n-type). It is noted that like and corresponding elements which were used in the first embodiment and can now be used within the third embodiment of the present disclosure have the same reference numerals.

The third embodiment includes the same basic processing steps as the first embodiment except that the at least one first semiconductor material 18 includes a semiconductor material that has a crystalline portion 18C and adjoining non-crystalline portions 18NC, and that the at least one second semiconductor material 26 includes a semiconductor material that has a crystalline portion 26C and adjoining non-crystalline portions 26NC.

Figure 19:
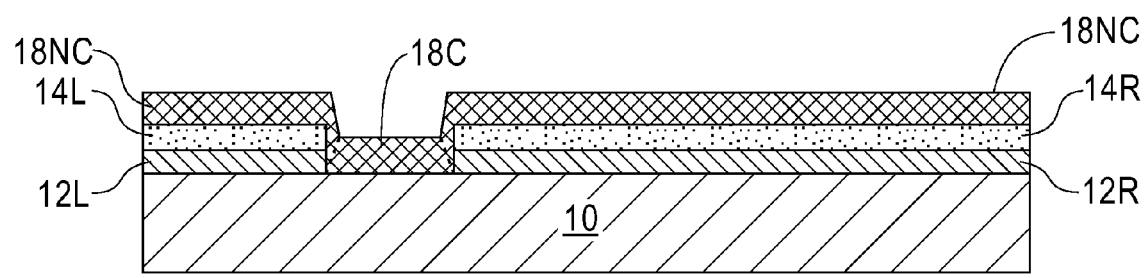
FIG. 19 is a pictorial representation (through a cross sectional view) illustrating the structure shown in FIG. 3 after forming at least a first semiconductor material comprising a crystalline semiconductor material portion and adjoining non-crystalline semiconductor material portions.

Referring first to FIG. 19, there is illustrated the structure shown in FIG. 3 after forming at least a first semiconductor material layer that comprises a crystalline semiconductor material portion 18C and adjoining non-crystalline semiconductor material portions 18NC. As shown, the crystalline semiconductor portion 18C is located directly on the exposed first surface portion of the crystalline semiconductor material 10, while the non-crystalline semiconductor portions 18NC are formed on all other surfaces. Such a semiconductor material can be formed as described above in conjunction with an embodiment described for forming the structure shown in FIG. 4. The first semiconductor material comprising the crystalline semiconductor material portion 18C and the adjoining non-crystalline semiconductor material portions 18NC can be hydrogenated or non-hydrogenated, and typically includes a dopant, as described in the first embodiment of the present disclosure. In one embodiment, the first semiconductor material comprising the crystalline semiconductor material portion 18C and the adjoining non-crystalline semiconductor material portions 18NC may comprise a same conductivity type dopant as the crystalline semiconductor material 10. In another embodiment, the first semiconductor material comprising the crystalline semiconductor material portion 18C and the adjoining non-crystalline semiconductor material portions 18NC may comprise an opposite conductivity type dopant as the crystalline semiconductor material 10.

Figure 20:
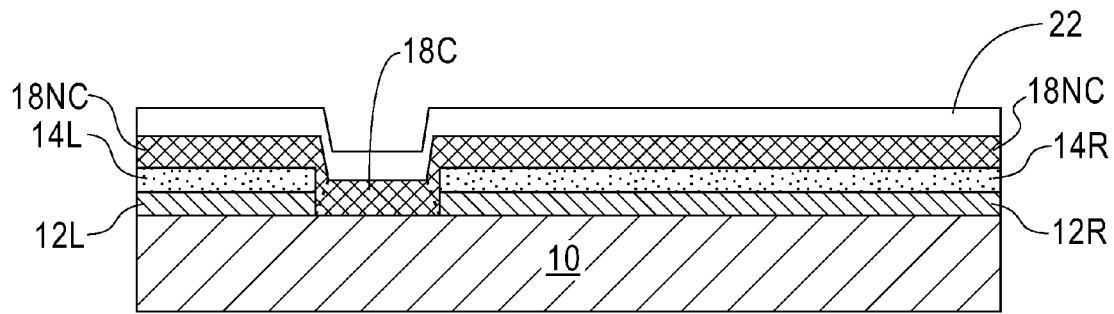
FIG. 20 is a pictorial representation (through a cross sectional view) illustrating the structure of FIG. 19 after forming another blanket layer of sacrificial material atop the first semiconductor material.

Referring now to FIG. 20, there is illustrated the structure of FIG. 19 after forming another blanket layer of sacrificial material 22 atop the first semiconductor material. The another blanket layer of sacrificial material 22 used in this embodiment of the present disclosure is the same as that mentioned above in conjunction with forming the structure shown in FIG. 7 of the first embodiment of the present disclosure. Note that no separate electrode material portion needs to be formed within the third embodiment of the present disclosure. As such, the processing sequence is reduced as compared to the processing sequence described above in the first embodiment of the present disclosure.

Figure 21:
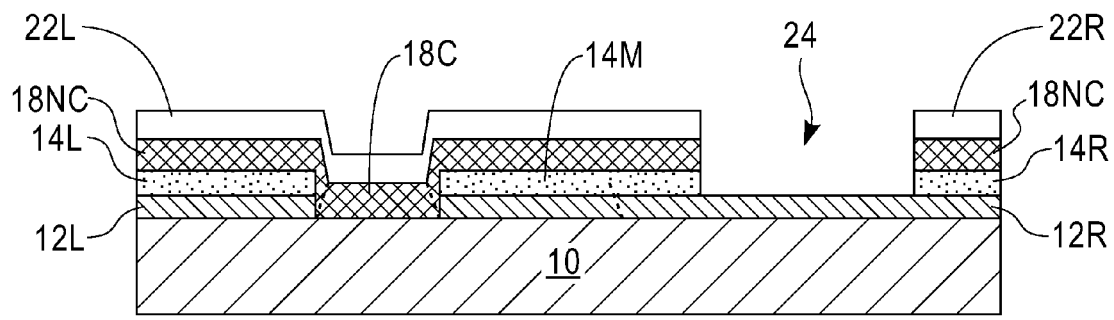
FIG. 21 is a pictorial representation (through a cross sectional view) illustrating the structure of FIG. 20 after forming a second contact opening within a portion of the another blanket layer of sacrificial material, a portion one of the non-crystalline semiconductor material portions of the first semiconductor material, and a remaining portion of one of the sacrificial material layer portions, wherein the second contact opening exposes a surface of one of the remaining passivation material layer portions.

Referring now to FIG. 21, there is illustrated the structure of FIG. 20 after forming a second contact opening 24 within a portion of the another blanket layer of sacrificial material 22, a portion one of the non-crystalline semiconductor material portions 18NC of the first semiconductor material, and one remaining portion of the sacrificial material 14L, 14R (by way of an example a portion of 14R is exposed in the drawings), wherein the second contact opening 24 exposes a surface of one of the remaining passivation material layer portions (by way of an example, 12R is exposed). The second contact opening 24 can be formed by lithography and etching as described above in conjunction with providing the second contact opening 24 within FIG. 8 of the first embodiment of the present disclosure. In this drawing, 14M denotes another remaining portion of the sacrificial material that is formed.

Figure 22:
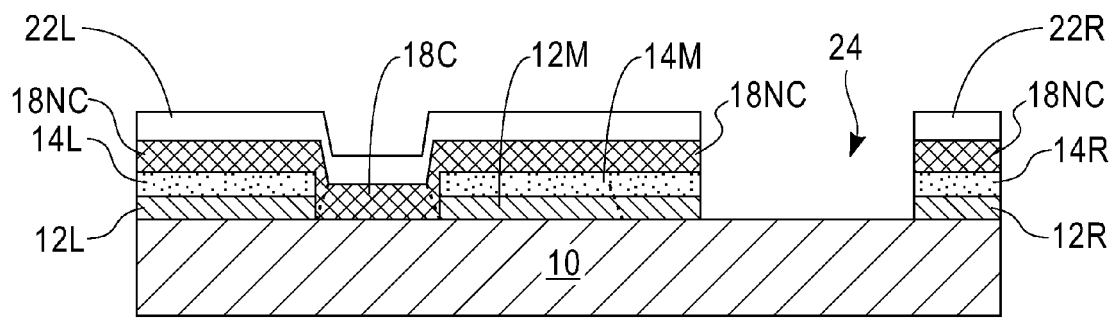
FIG. 22 is a pictorial representation (through a cross sectional view) illustrating the structure of FIG. 21 after transferring the second contact opening to the exposed remaining passivation material layer portion, wherein after the transferring of the second contact opening, a second surface portion of the crystalline semiconductor material is exposed.

Referring now to FIG. 22, there is illustrated the structure of FIG. 21 after transferring the second contact opening 24 to the exposed passivation material layer portion (e.g., 12R), wherein after the transferring of the second contact opening 24, a second surface portion of the crystalline semiconductor material 10 is exposed. The transferring of the second contact opening 24 into one of the remaining passivation material layer portions (e.g., 12R) includes the same etch or etches as described above in conjunction with providing the structure shown in FIG. 9 of the first embodiment of the present disclosure.

Figure 23:
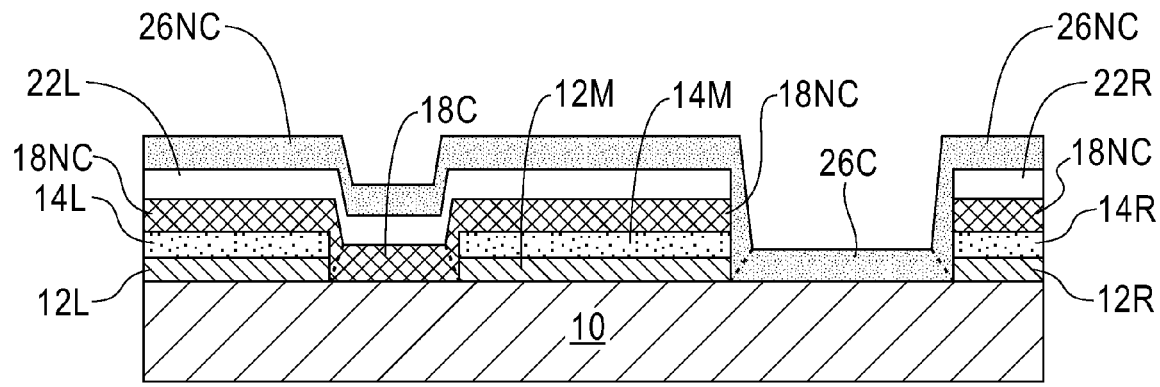
FIG. 23 is a pictorial representation (through a cross sectional view) illustrating the structure of FIG. 22 after forming at least a second semiconductor material on the second surface portion of the crystalline semiconductor material and remaining portions of the another blanket layer of sacrificial material, wherein the second semiconductor material includes a second crystalline semiconductor material portion and adjoining non-crystalline semiconductor portions.

Referring now to FIG. 23, there is illustrated the structure of FIG. 22 after forming at least a second semiconductor material on the exposed second surface portion of the crystalline semiconductor material 10 and atop remaining portions of the another blanket layer of sacrificial material 22L, 22R, wherein the second semiconductor material includes a second crystalline semiconductor material portion 26C an adjoining non-crystalline semiconductor portions 26NC. As shown, the crystalline semiconductor portion 26C is located directly on the exposed second surface portion of the crystalline semiconductor material 10, while the non-crystalline semiconductor portions 26NC are formed on all other surfaces. Such a semiconductor material can be formed as described above in conjunction with an embodiment described for forming the structure shown in FIG. 4. The second semiconductor material comprising the crystalline semiconductor material portion 26C and the adjoining non-crystalline semiconductor material portions 26NC can be hydrogenated or non-hydrogenated, and typically includes a dopant, as described in the first embodiment of the present disclosure. In this embodiment, the second semiconductor material comprising the crystalline semiconductor material portion 26C and the adjoining non-crystalline semiconductor material portions 26NC comprise a different conductivity type dopant as compared to the first semiconductor material comprising the crystalline semiconductor material portion 18C and the adjoining non-crystalline semiconductor material portions 18NC.

Figure 24:
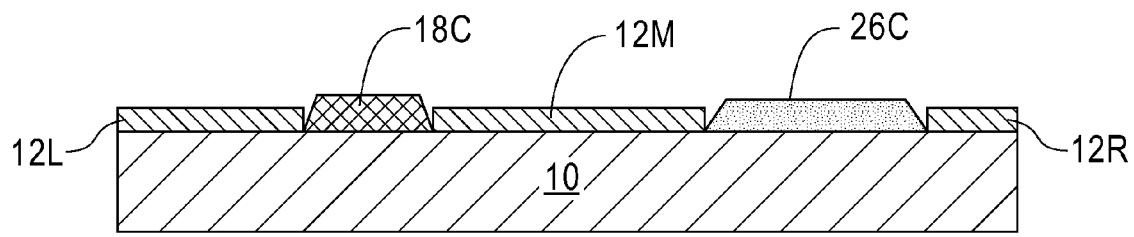
FIG. 24 is a pictorial representation (through a cross sectional view) illustrating the structure of FIG. 23 after performing an etch.

Referring to FIG. 24, there is illustrated the structure shown in FIG. 23 after performing an etch. The etch removes non-crystalline semiconductor portions 26NC, all remaining portions of the other blanket layer of sacrificial material 22L, 22M, 22R, non-crystalline semiconductor portions 18NC, and all remaining portions of the blanket layer of sacrificial material 14L, 14M, 14R. The etch used in providing the structure shown in FIG. 24 includes an etch process which selectively removes non-crystalline layers (without removing or negligibly removing the crystalline layers). An example of such an etch process is disclosed, for example, in U.S. Patent Publication No. 2012/0210932, the entire content of which is incorporated herein by reference. In one embodiment, this etch process is performed in-situ. A non-limiting example of such an etch process which can be used in removing non-crystalline semiconductor materials selective to crystalline semiconductor material is etching by hydrogen plasma.

As shown in FIG. 24, the crystalline semiconductor portions 18C and 26C which remain represent a first semiconductor material contact and a second semiconductor material contact, respectively.

In some embodiments, the first contact opening (or the first set of contact opening) may be formed using the process flow of FIGS. 19-24, but the second contact opening (or the second set of contact opening) may be formed using the process flow of FIGS. 1-12. This is shown schematically in FIGS. 25-27. In these embodiments, the semiconducting layer (or layers) forming the second contact region (or the second set of contact regions) does not need to be (but may be) crystalline over the second contact opening(s) and a layer or layers of non-crystalline materials or a stack of crystalline and non-crystalline layers may be used as well.

Figure 25:
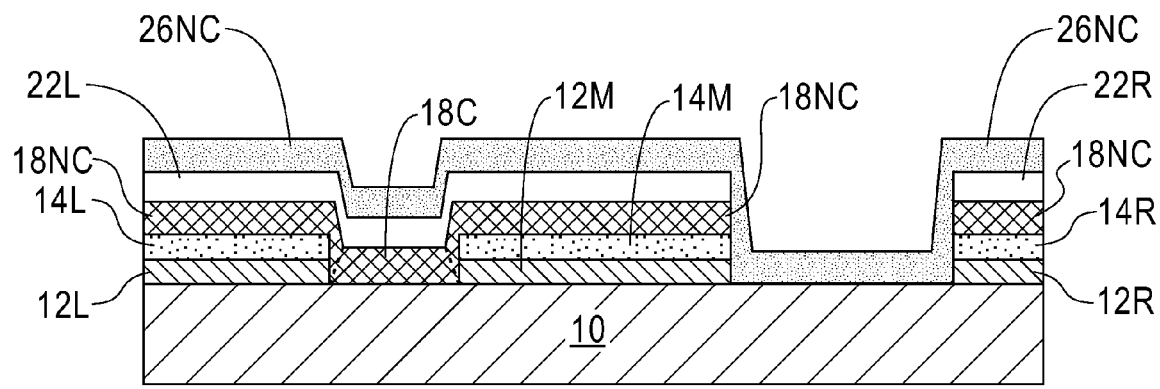
FIG. 25 is a pictorial representation (through a cross sectional view) illustrating the structure of FIG. 22 after forming at least a second semiconductor material that is non-crystalline on the second surface portion of the crystalline semiconductor material and remaining portions of the another blanket layer of sacrificial material in accordance with yet another embodiment of the present disclosure.

Referring first to FIG. 25, there is illustrated the structure of FIG. 22 after forming at least a second semiconductor material 26NC that is non-crystalline on the second surface portion of the crystalline semiconductor material 10 and remaining portions of the another blanket layer of sacrificial material 22L, 22R in accordance with this embodiment of the present disclosure. The non-crystalline second semiconductor material 26NC may include one of the semiconductor materials mentioned above for the at least one first semiconductor material 18, it may be hydrogenated or non-hydrogenated and it is of a conductivity that is opposite from the conductivity type of the semiconductor material layer(s) which define the at least one first semiconductor material 18. The crystalline second semiconductor material 26NC can be formed by PECVD, hot-wire CVD, or sputtering as defined above using precursor and other gases as also defined above.

Figure 26:
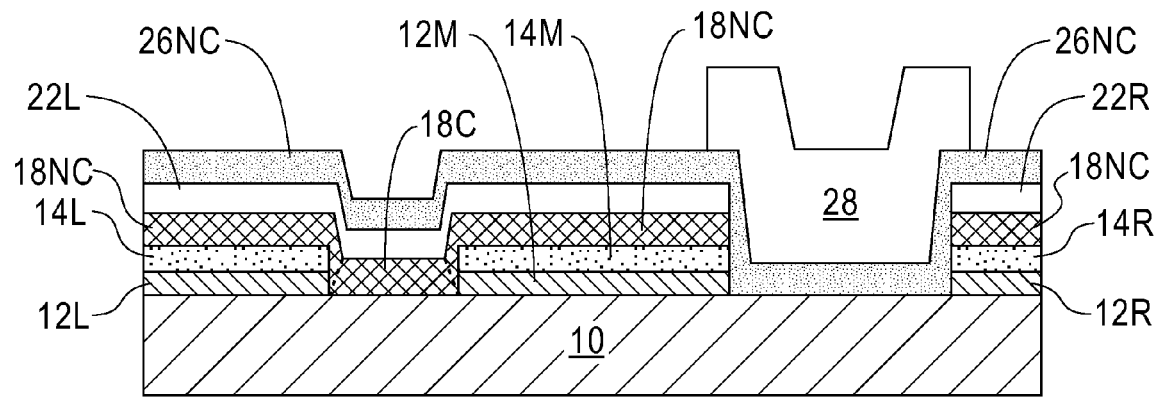
FIG. 26 is a pictorial representation (through a cross sectional view) illustrating the structure of FIG. 25 after forming an electrode material portion on a portion of the at least second semiconductor material and atop the second contact opening.

Referring now to FIG. 26, there is illustrated the structure of FIG. 25 after forming an electrode material portion 28 on a portion of at least the non-crystalline second semiconductor material 28NC and atop the second contact opening 24. Electrode material portion 28 includes one of the conductive materials mentioned above for the first electrode material portion 20, and it can also be formed utilizing one of the techniques mentioned above in forming the first electrode material portion 20.

Figure 27:
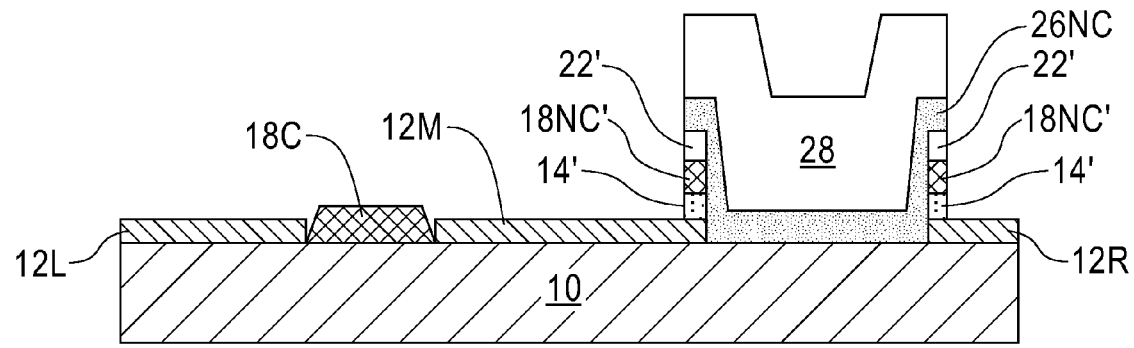
FIG. 27 is a pictorial representation (through a cross sectional view) illustrating the structure of FIG. 26 after etching using the electrode material portion as an etch mask.

Referring now to FIG. 27, there is illustrated the structure of FIG. 26 after etching using the electrode material portion 28 as an etch mask. In this embodiment, the etch or etches mentioned above in conjunction with forming the structure shown in FIG. 24 can be used. The etch used in this step of the present disclosure and within this embodiment, stops on remaining passivation material layer portions 12L, 12M, 12R and atop the crystalline semiconductor material portion 18C. Within this drawing reference number 14' denotes a remaining portion of the sacrificial material 14, 18NC' denotes a remaining portion of the non-crystalline semiconductor material portion of the first semiconductor material, and 22' denotes a remaining portion of the sacrificial material 22. The vertical edges of elements 14', 18NC, 22', 26NC, and 28 are coincident to each other.

Note that the process flows within the various embodiments of the present disclosure are non-limiting examples, and may include process steps not shown (for example thermal or chemical treatments) or some process steps may be carried out differently, or in different order. For example, in some embodiments, other processes or device fabrication steps may be performed between forming a first contact region (or a first set of contact regions) and forming a second (or a second set of contact regions) on the same device area, in the vicinity of the same device area, or at other parts of the chip. Also, other process steps typically precede and/or follow the process steps shown in these examples. Also variations to the illustrated process flows (in order, and/or non-critical steps) may be perceived by one skilled in the art.

Figure 28A:
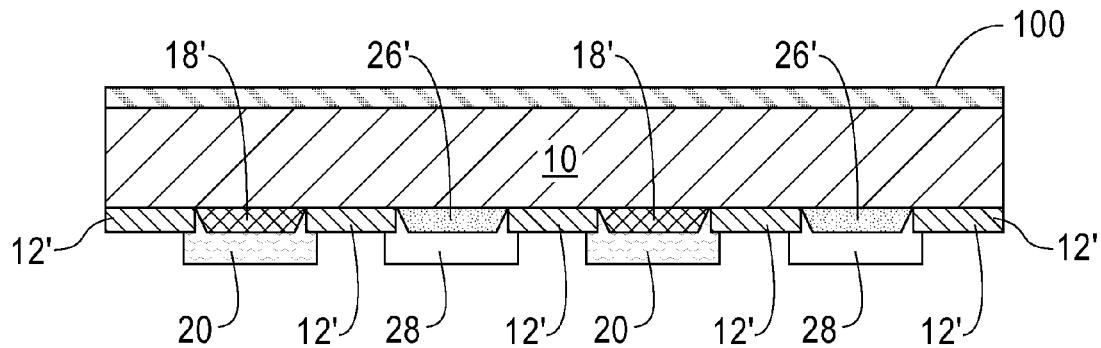
FIGS. 28A-28B are pictorial representations (through cross sectional views) illustrating exemplary homojunction (FIG. 28A) and heterojunction (FIG. 28B) inter-digitated back contact solar cells containing semiconductor contacts that can be formed in accordance with the present disclosure.
Figure 28B:
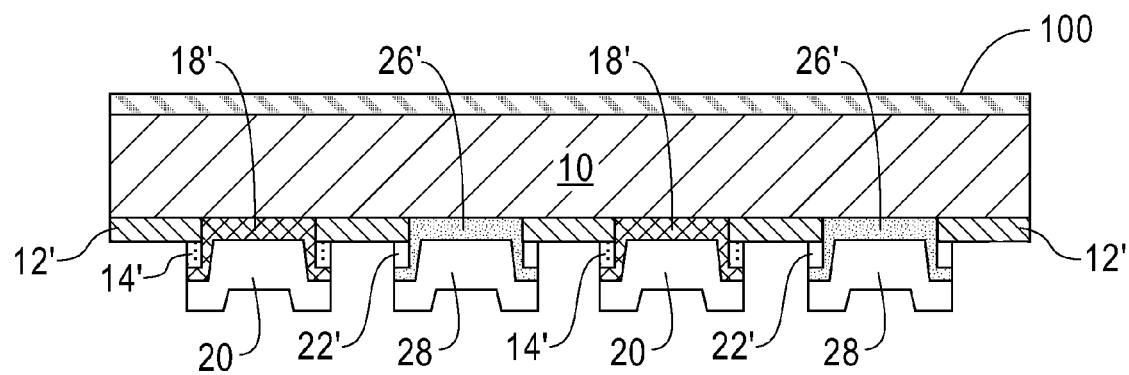

Some of non-limiting structures that can be formed utilizing the various methods of the present disclosure are now described. Referring first to FIGS. 28A-28B, there are illustrated exemplary homojunction (FIG. 28A) and heterojunction (FIG. 28B) inter-digitated back contact solar cells containing semiconductor contacts that can be formed in accordance with the present disclosure. Each structure includes a crystalline semiconductor material 10, such as a Si substrate, which may be n-type of p-type. On one side of each crystalline semiconductor material 10 there is present material layer 100 which may comprise a passivation material, an antireflective coating and/or a front-surface field. On the other side of each crystalline semiconductor material 10 that is present first semiconductor material contacts 18' and second semiconductor material contacts 26'; the first and second semiconductor material contacts are present in an alternating sequence as shown. Within these structures reference numeral 20 denotes a first electrode material portion, reference numeral 14' denotes a remaining portion of the sacrificial material 14, reference numeral 28 denotes a second electrode material portion, and reference numeral 22' denotes a remaining portion of another sacrificial material 22.

In FIG. 28A, the first semiconductor material contact 18' may comprise a layer of n+c-Si:H, and the second semiconductor material contact 26' may comprise a layer of p+c-Si:H; wherein "a" is amorphous, "H" is hydrogenated; and "c" is crystalline. In FIG. 28B and in one embodiment, the first semiconductor material contact 18' may comprise, a bilayer of, from top to bottom, n+c-Si:H and n+a-Si:H (for simplicity, the bilayer within FIG. 28B and any of the other drawings is shown as a single layer), and the second semiconductor material contact 26' may comprise a multilayered structure of, from bottom to top, intrinsic a-Si:H, p+a-Si:H, p+a-Ge:H, and p+a Si:H (for simplicity, the multilayered structure within FIG. 28B and any of the other drawings is shown as a single layer). In FIG. 28B and in another embodiment, the first semiconductor material contact 18' may comprise a bilayer of, from bottom to top, intrinsic a-Si:H and n+a-Si:H, while the second semiconductor material contact 26' may include, a bilayer of, from bottom to top, an intrinsic a-Si:H and p+a-Si:H.

Within some embodiments of the structures shown FIGS. 28A and 28B, the contact regions having the opposite conductivity type as that of the crystalline semiconductor material 10 serve as emitter contacts and the contact regions having the same conductivity type as that of the crystalline substrate material 10 serve as the back surface field regions of the solar cells. Note that in some embodiments, the contact regions include a thin layer of intrinsic (i) material at the interface with the substrate to improve the surface passivation of the substrate, as known in the art. A first set of contact regions having the same conductivity type (n-type or p-type) are formed according to the method disclosed for forming the first contact region (or the first set of contact regions), and a second set of contact regions having the same conductivity type opposite to the first conductivity type as that of the first set (p-type or n-type) are formed according to the method disclosed for forming the second contact region (or the second set of contact regions). In this example, the embodiment of FIG. 28A can be formed using the process flow illustrated in FIGS. 19-24, while the embodiment of FIG. 28B can be formed using the process flow illustrated within FIGS. 1-12. An actual large area solar cell will include several n-type contacts and several p-type contacts (not just two of each as illustrated in FIGS. 28A-28B).

Figure 29A:
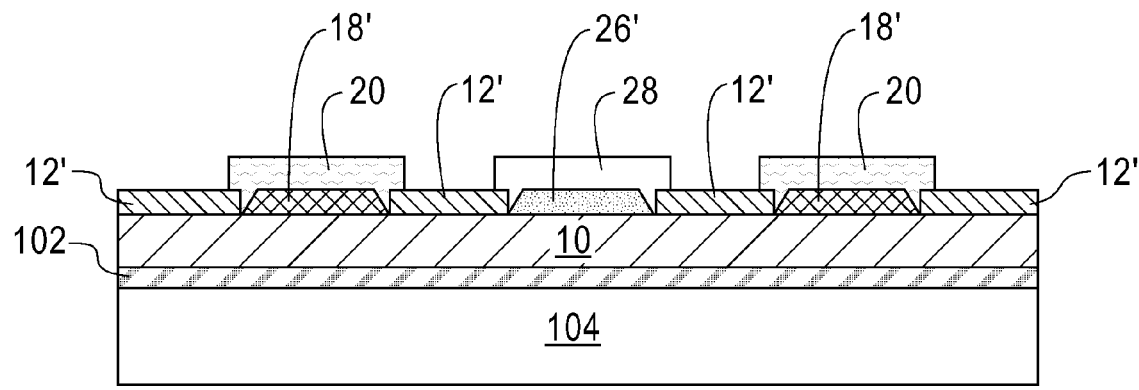
FIGS. 29A-29B are pictorial representations (through cross sectional views) illustrating exemplary n-p-n or p-n-p homojunction (FIG. 29A) and heterojunction (FIG. 29B) lateral bipolar transistors containing semiconductor contacts that can be formed in accordance with the present disclosure.
Figure 29B:
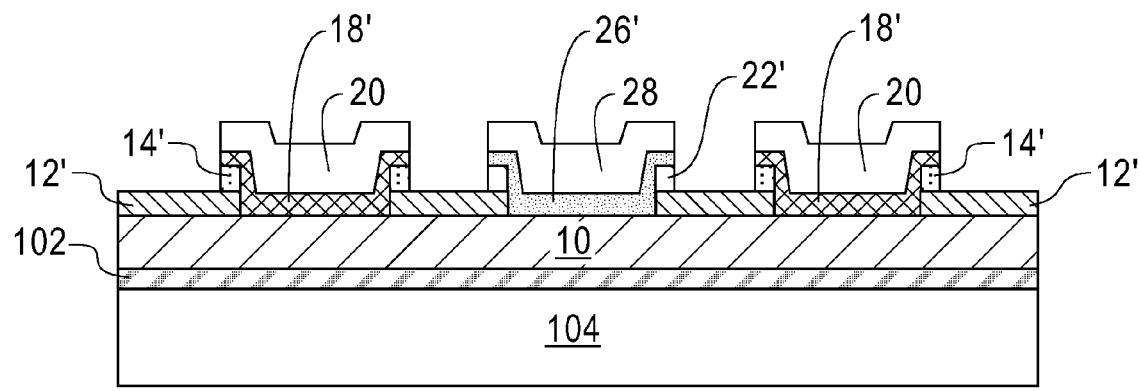

A few non-limiting examples of lateral n-p-n or p-n-n bipolar junction transistors formed using the disclosed process flows are illustrated FIGS. 29A-29B. Specifically, FIG. 29A represents a homojunction lateral bipolar transistor, while FIG. 29B represents a heterojunction lateral bipolar transistor. Each structure includes a crystalline semiconductor material 10. In these structures, each crystalline semiconductor material 10 represents an uppermost surface of a semiconductor-on-insulator substrate which also includes a buried insulating material 102, and an underlying handle substrate 104. On one side of each crystalline semiconductor contacts that is present two first semiconductor material contacts 18' and a second semiconductor material contact 26'. The second semiconductor material contact 26' is located between the two first semiconductor material contacts 18'. Within these structures reference numeral 20 denotes a first electrode material portion, reference numeral 14' denotes a remaining portion of the blanket layer of sacrificial material 14, reference numeral 28 denotes a second electrode material portion, and reference numeral 22' denotes a remaining portion of the another blanket layer of sacrificial material 22. Within FIGS. 29A-29B, one of the first semiconductor material contacts 18' can be an emitter contact, while another of the first semiconductor material contacts 18' can be a collector contact. The second semiconductor contact 26' is a base contact.

For an n-p-n embodiment, the crystalline semiconductor material 10 is of a p-conductivity type. In FIG. 29A and in such an embodiment, each first semiconductor material contact 18' comprises a layer of a n+c-Si:H, while the second semiconductor material contact 26' comprises a layer of p+c-Si:H. In FIG. 29B and for the n-p-n embodiment several different semiconductor contact structures can be used. For example, and in one embodiment, each first semiconductor material contact 18' can comprises, a bilayer of, from top to bottom, n+c-Si:H and n+a-Si:H, and the second semiconductor material contact 26' can comprise a multilayered structure of, from bottom to top, intrinsic a-Si:H, p+a-Si:H, p+a-Ge:H, and p+a Si:H. In another example, each first semiconductor material contact 18' within FIG. 29B may comprise a bilayer of, from bottom to top, intrinsic a-Si:H and n+a-Si:H, while the second semiconductor material contact 26' within FIG. 29B may include, a bilayer of, from bottom to top, an intrinsic a-Si:H and p+a-Si:H. In another example, each first semiconductor material contact 18' within FIG. 29B may comprise a bilayer of, from bottom to top, intrinsic a-Si:H and n+a-Si:H, while the second semiconductor material contact 26' within FIG. 29B may include, a multilayered stack of, from bottom to top, an intrinsic a-Si:H, p+a-Si:H, p+Ge:H and p+a-SiH.

For a p-n-p embodiment, the crystalline semiconductor material 10 is of an n-conductivity type. In FIG. 29A and in such an embodiment, each first semiconductor material contact 18' comprises a layer of a p+c-Si:H, while the second semiconductor material contact 26' comprises a layer of n+c-Si:H. In FIG. 29B and for the p-n-p embodiment several different semiconductor contact structures can be used. For example, and in one embodiment, each first semiconductor material contact 18' can comprises a multilayered structure of, from bottom to top, intrinsic a-Si:H, p+a-Si:H, p+a-Ge:H, and p+a Si:H, and the second semiconductor material contact 26' can comprise a bilayer of, from top to bottom, n+c-Si:H and n+a-Si:H. In another example, each first semiconductor material contact 18' within FIG. 29B may comprise a bilayer of, from bottom to top, intrinsic a-Si:H and p+a-Si:H, and while the second semiconductor material contact 26' within FIG. 29B may include, a bilayer of, from bottom to top, an intrinsic a-Si:H and n+a-Si:H. In yet another example, each first semiconductor contact within FIG. 29 may comprise a multilayered stack of, from bottom to top, an intrinsic a-Si:H, p+a-Si:H, p+Ge:H and p+a-SiH, while the second semiconductor material contact 26' within FIG. 29B may include, a bilayer of, from bottom to top, an intrinsic a-Si:H and n+a-Si:H.

The embodiment of FIG. 29A is formed using the process flow illustrated in 19-24, while the embodiment of FIG. 29B is formed using the process flow illustrated in FIGS. 1-12. In some embodiments, the emitter and collector regions are formed according to the method disclosed for forming the first contact region (or the first set of contact regions), and the base contact is formed according to the method disclosed for forming the second contact region (or the second set of contact regions). In other embodiments, the base region is formed according to the method disclosed for forming the first contact region (or the first set of contact regions), and the emitter and collector contacts are formed according to the method disclosed for forming the second contact region (or the second set of contact regions). Note that in this example, the emitter and collector contacts are the same, and therefore they can be formed simultaneously. However, in other embodiments, the emitter and collector contacts may be comprised of different layers and therefore an additional contact region formation step will be required. Although the present disclosure has been described using examples that illustrate the formation of two contact regions (or two sets of contact regions), it is clear that it can be extended to an arbitrary number of contact regions (or arbitrary sets of contact regions). In addition, although the two contact regions (or two sets of contact regions) in the illustrated examples have opposite conductivity types, it is clear that the present disclosure is applicable to contact regions (or sets of contact regions) having the same conductivity types as well.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor material contact comprising:
    forming a material stack of, from bottom to top, a blanket layer of passivation material and a blanket layer of sacrificial material on a surface of a crystalline semiconductor material;
    lithographically patterning the blanket layer of sacrificial material to provide a first contact opening within said blanket layer of sacrificial material;
    transferring the first contact opening into the blanket layer of passivation material using remaining sacrificial material layer portions as an etch mask, wherein after transferring said first contact opening into the blanket layer of passivation material, a first surface portion of the crystalline semiconductor material is exposed;
    forming at least one first semiconductor material on the first surface portion of the crystalline semiconductor material and atop said remaining sacrificial material layer portions;
    forming a first electrode material portion on a topmost surface of the at least one first semiconductor material and above the first contact opening; and
    removing exposed portions of the at least one first semiconductor material and sacrificial material layer portions not protected by the first electrode material portion, wherein a remaining portion of the at least one first semiconductor material beneath the first electrode material portion comprises a first semiconductor material contact.

2. The method of claim 1, wherein said transferring the first contact opening into the blanket layer of passivation material comprises etching in dilute HF, and wherein said etching in dilute HF provides hydrogen termination to said first surface portion of said crystalline semiconductor material.

3. The method of claim 1, wherein said blanket layer of sacrificial material is more HF resistant than said blanket layer of passivation material.

4. The method of claim 1, wherein said at least one first semiconductor material comprises a multilayered stack comprises various layers of semiconductor materials.

5. The method of claim 1, wherein a remaining sacrificial material portion is present between a bottommost surface portion of the first semiconductor contact material and an uppermost surface portion of each remaining passivation material layer portion, and wherein outer vertical edges of said first electrode material portion, said first semiconductor contact material, and said remaining sacrificial material portion are coincident.

6. The method of claim 1, further comprising,
forming another blanket layer of other sacrificial material on remaining passivation material layer portions and atop the first electrode material portion;
lithographically patterning the another blanket layer of other sacrificial material to provide a second contact opening within said another blanket layer of other sacrificial material;
transferring the second contact opening into one of the remaining passivation material portions using remaining other sacrificial material layer portions as an etch mask, wherein after transferring said second contact opening into the remaining passivation material layer portion, a second surface portion of the crystalline semiconductor material is exposed;
forming at least one second semiconductor material on the second surface portion of the crystalline semiconductor material and atop said remaining other sacrificial material layer portions;
forming a second electrode material portion on a topmost surface of the at least one second semiconductor material and atop the second contact opening;
removing exposed portions of the at least one second semiconductor material and other sacrificial material layer portions not protected by the second electrode material portion, wherein a remaining portion of the at least one second semiconductor material beneath the second electrode material portion comprises a second semiconductor material contact.

7. The method of claim 6, wherein said first semiconductor material contact and said second material contact are of an opposite conductivity type.

8. The method of claim 6, wherein said transferring the second contact opening into one of the remaining passivation material layer portions comprises etching in dilute HF, and wherein said etching in dilute HF provides hydrogen termination to said second surface portion of said crystalline semiconductor material.

9. The method of claim 6, wherein said another blanket layer of other sacrificial material is more HF resistant than said blanket layer of passivation material.

10. The method of claim 6, wherein said at least one second semiconductor material comprises a multilayered stack comprises various layers of semiconductor materials.

11. The method of claim 6, wherein a remaining other sacrificial material portion is present between a bottommost surface portion of the second semiconductor contact material and an uppermost surface portion of each remaining passivation material layer portion, and wherein outer vertical edges of said second electrode material portion, said second semiconductor contact material, and said remaining other sacrificial material portion are coincident.

12. A method of forming semiconductor material contacts comprising:
forming a material stack of, from bottom to top, a blanket layer of passivation material and a first blanket layer of first sacrificial material on a surface of a crystalline semiconductor material;
lithographically patterning the first blanket layer of first sacrificial material to provide a first contact opening within said first blanket layer of first sacrificial material;
transferring the first contact opening into the blanket layer of passivation material using remaining first sacrificial material layer portions as an etch mask, wherein after transferring said first contact opening into the blanket layer of passivation material, a first surface portion of the crystalline semiconductor material is exposed;
forming at least one first semiconductor material on the first surface portion of the crystalline semiconductor material and atop said remaining first sacrificial material layer portions;
forming a first electrode material portion on a topmost surface of the at least one first semiconductor material and above the first contact opening;
forming a second blanket layer of second sacrificial material on exposed portions of the at least one first semiconductor material and said first electrode material portion;
lithographically patterning the second blanket layer of second sacrificial material, a portion of the at least one first semiconductor material and one of the remaining first sacrificial material layer portions to provide a second contact opening;
transferring the second contact opening into one of the remaining passivation material portions using remaining second sacrificial material layer portions as an etch mask, wherein after transferring said second contact opening, a second surface portion of the crystalline semiconductor material is exposed;
forming at least one second semiconductor material on the second surface portion of the crystalline semiconductor material and atop said remaining second sacrificial material layer portions;
forming a second electrode material portion on a topmost surface of the at least one second semiconductor material and atop the second contact opening; and
removing remaining second sacrificial material layer portions, remaining portions of the at least one first semiconductor material, and remaining first sacrificial material layer portions using said second electrode material portion and said first electrode material portion as etch masks, wherein a remaining portion of the at least one first semiconductor material beneath the first electrode material portion comprises a first semiconductor material contact, and wherein a remaining portion of the at least one second semiconductor material beneath the second electrode material portion comprises a second semiconductor material contact.

13. The method of claim 12, wherein said first semiconductor material contact and said second material contact are of an opposite conductivity type.

14. The method of claim 12, wherein said transferring the first contact opening into the first blanket layer of passivation material comprises etching in dilute HF, and wherein said etching in dilute HF provides hydrogen termination to said first surface portion of said crystalline semiconductor material.

15. The method of claim 12, wherein said transferring the second contact opening comprises etching in dilute HF, and wherein said etching in dilute HF provides hydrogen termination to said second surface portion of said crystalline semiconductor material.

16. The method of claim 12, wherein said first blanket layer of first sacrificial material and said second blanket layer of second sacrificial material are more HF resistant than said blanket layer of passivation material.

17. A method of forming semiconductor material contacts comprising:
forming a material stack of, from bottom to top, a blanket layer of passivation material and a first blanket layer of first sacrificial material on a surface of a crystalline semiconductor material;

lithographically patterning the first blanket layer of first sacrificial material to provide a first contact opening within said first blanket layer of first sacrificial material;

transferring the first contact opening into the blanket layer of passivation material using remaining first sacrificial material layer portions as an etch mask, wherein after transferring said first contact opening into the blanket layer of passivation material, a first surface portion of the crystalline semiconductor material is exposed;

forming a first semiconductor material comprising a crystalline semiconductor portion and adjoining non-crystalline semiconductor portions, wherein said crystalline semiconductor portion is located on the first surface portion of the crystalline semiconductor material, and said non-crystalline semiconductor portions are formed atop said remaining first sacrificial material layer portions;

forming a second blanket layer of second sacrificial material on said first semiconductor material;

lithographically patterning the second blanket layer of second sacrificial material to provide a second contact opening within said second blanket layer of second sacrificial material, one of the non-crystalline portions of the first semiconductor material, and one of the remaining first sacrificial material layer portions;

transferring the second contact opening into one remaining passivation material layer portion using remaining second sacrificial material layer portions as an etch mask, wherein after transferring said second contact opening, a second surface portion of the crystalline semiconductor material is exposed;

forming a second semiconductor material comprising a crystalline semiconductor portion and adjoining non-crystalline semiconductor portions, wherein said crystalline semiconductor portion is located on the second surface portion of the crystalline semiconductor material, and said non-crystalline semiconductor portions are formed atop said remaining second sacrificial material layer portions; and removing said non-crystalline semiconductor portions of the second semiconductor material, remaining second sacrificial material layer portions, said non-crystalline semiconductor materials of the first semiconductor material and said remaining first sacrificial material layer portions stopping on a topmost surface of the crystalline semiconductor portions of the first and second semiconductor material.

18. The method of claim 17, wherein said crystalline semiconductor material of the first semiconductor material is of an opposite conductivity type than the crystalline semiconductor material of the second semiconductor material.

19. The method of claim 17, wherein said transferring the first contact opening into the first blanket layer of passivation material comprises etching in dilute HF, and wherein said etching in dilute HF provides hydrogen termination to said first surface portion of said crystalline semiconductor material.

20. The method of claim 17, wherein said transferring the second contact opening comprises etching in dilute HF, and wherein said etching in dilute HF provides hydrogen termination to said second surface portion of said crystalline semiconductor material.

21. The method of claim 17, wherein said first blanket layer of first sacrificial material and said second blanket layer of second sacrificial material are more HF resistant than said blanket layer of passivation material.

22. A method of forming semiconductor material contacts comprising:

forming a material stack of, from bottom to top, a blanket layer of passivation material and a first blanket layer of first sacrificial material on a surface of a crystalline semiconductor material;

lithographically patterning the first blanket layer of first sacrificial material to provide a first contact opening within said first blanket layer of first sacrificial material;

transferring the first contact opening into the blanket layer of passivation material using remaining first sacrificial material layer portions as an etch mask, wherein after transferring said first contact opening into the blanket layer of passivation material, a first surface portion of the crystalline semiconductor material is exposed;

forming a first semiconductor material comprising a crystalline semiconductor portion and adjoining non-crystalline semiconductor portions, wherein said crystalline semiconductor portion is located on the first surface portion of the crystalline semiconductor material, and said non-crystalline semiconductor portions are formed atop said remaining first sacrificial material layer portions;

forming a second blanket layer of second sacrificial material on said first semiconductor material;

lithographically patterning the second blanket layer of second sacrificial material to provide a second contact opening within said second blanket layer of second sacrificial material, one of the non-crystalline portions of the first semiconductor material, and one of the remaining first sacrificial material layer portions;

transferring the second contact opening into one remaining passivation material layer portion using remaining second sacrificial material layer portions as an etch mask, wherein after transferring said second contact opening, a second surface portion of the crystalline semiconductor material is exposed;

forming a non-crystalline second semiconductor material on the second surface portion of the crystalline semiconductor material and atop said remaining second sacrificial material layer portions;

forming an electrode material portion on a surface of the non-crystalline second semiconductor material and atop the second contact opening; and removing exposed portions of the non-crystalline second semiconductor material, remaining second sacrificial material layer portions, said non-crystalline semiconductor materials of the first semiconductor material and said remaining first sacrificial material layer portions stopping on a topmost surface of the crystalline semiconductor portion of the first semiconductor material and a portion of the non-crystalline second semiconductor material.

23. The method of claim 22, wherein said crystalline semiconductor material of the first semiconductor material is of an opposite conductivity type than the remaining portion of the non-crystalline semiconductor material of the second semiconductor material.

24. The method of claim 22, wherein said transferring the first contact opening into the first blanket layer of passivation material comprises etching in dilute HF, and wherein said etching in dilute HF provides hydrogen termination to said first surface portion of said crystalline semiconductor material.

25. The method of claim 22, wherein said transferring the second contact opening comprises etching in dilute HF, and wherein said etching in dilute HF provides hydrogen termination to said second surface portion of said crystalline semiconductor material.

26. The method of claim 22, wherein said first blanket layer of first sacrificial material and said second blanket layer of second sacrificial material are more HF resistant than said blanket layer of passivation material.

* * * * *